US005642076A

United States Patent [19]
Naokawa et al.

[11] Patent Number: 5,642,076
[45] Date of Patent: Jun. 24, 1997

[54] NO TURN-ON POP NOISE AMPLIFIER

[75] Inventors: Toyojiro Naokawa, Saitama; Hiroshi Hirayama, Nara, both of Japan

[73] Assignee: National Semiconductor Corporation, Santa Clara, Calif.

[21] Appl. No.: 384,274

[22] Filed: Jan. 31, 1995

[51] Int. Cl.[6] ................................................ H03F 1/26
[52] U.S. Cl. ................................................ 330/149; 381/94
[58] Field of Search ............................. 330/51, 69, 149; 381/94, 120, 121

[56] References Cited

U.S. PATENT DOCUMENTS 4,638,507  1/1987  Palara et al. ...................... 381/94

Primary Examiner—Steven Mottola
Attorney, Agent, or Firm—Skjerven, Morrill, MacPherson, Franklin & Friel; Edward C. Kwok

[57] ABSTRACT

An audio amplifier with no turn-on pop noise is achieved by the following features: (i) an input stage which operates under zero common-mode input voltage, (ii) an output stage which provides the low voltage end of its voltage swing very close to ground voltage, and (iii) a system of shunt circuits for discharging external capacitors, so as to prevent, upon subsequent power-up, pop noises due to residue charges in the external capacitors. In one embodiment, two peripheral collector transistors are provided to implement a window comparator for discharging the input terminals, the bias voltage and the output terminal of the audio amplifier.

5 Claims, 48 Drawing Sheets

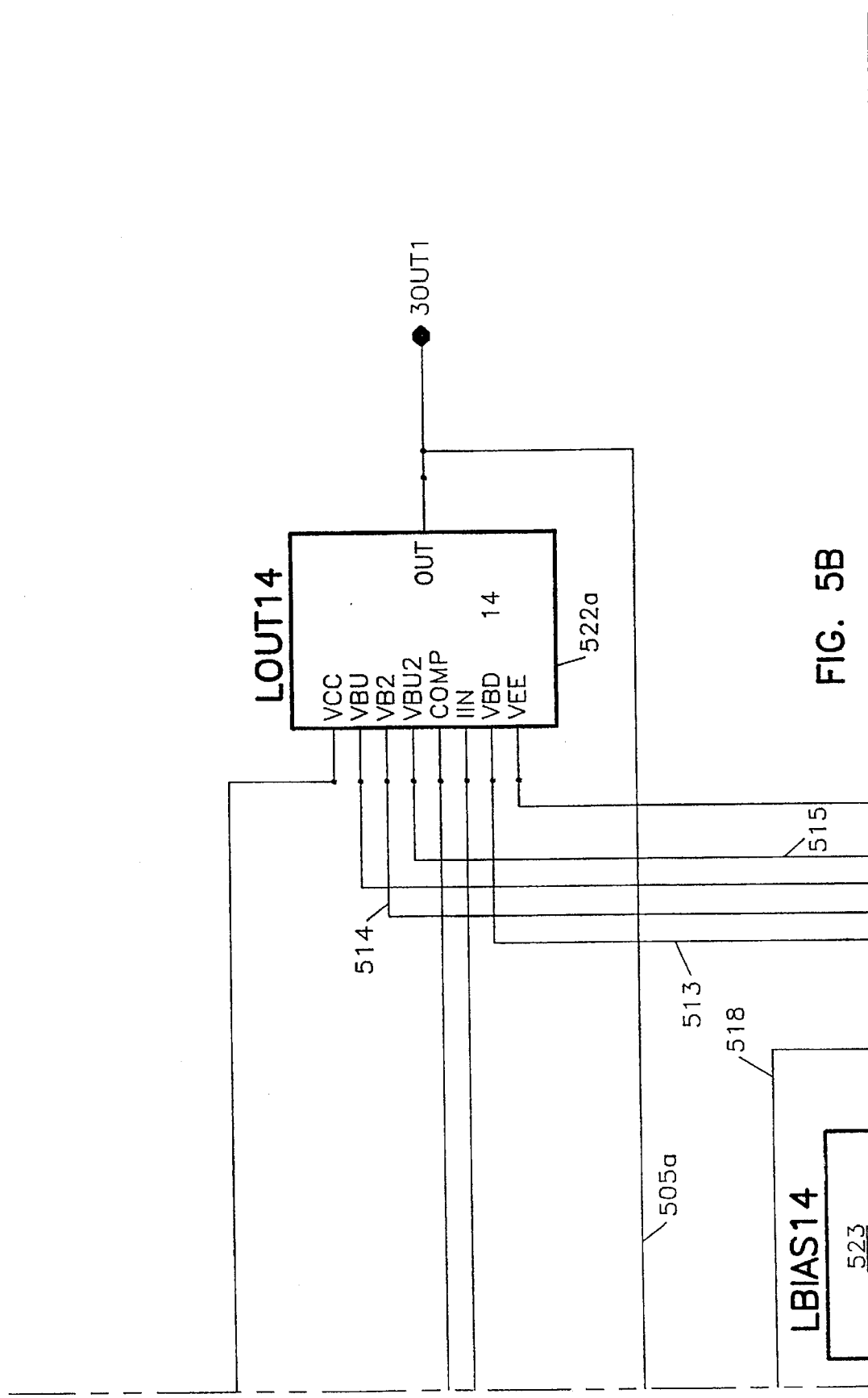

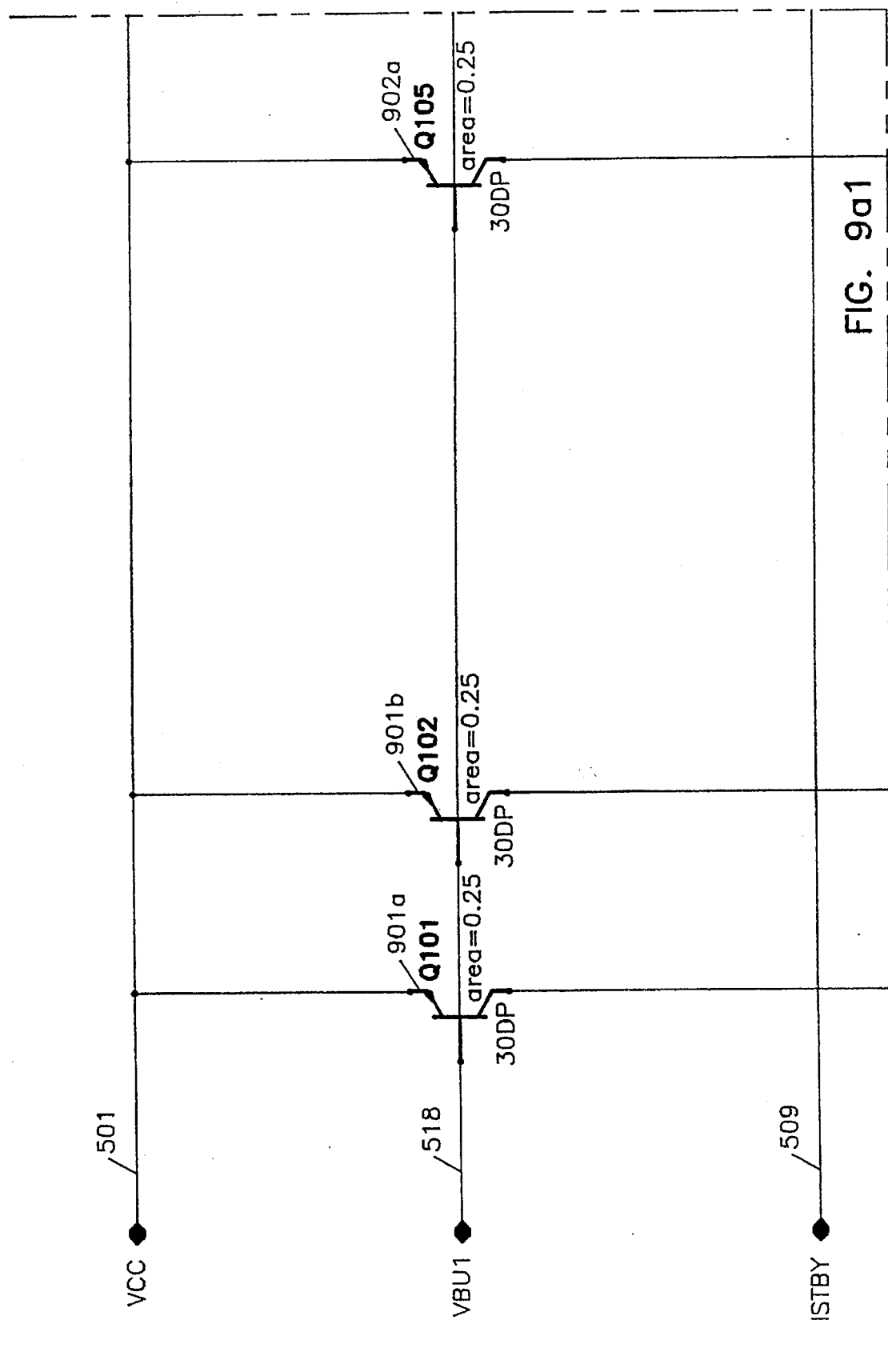

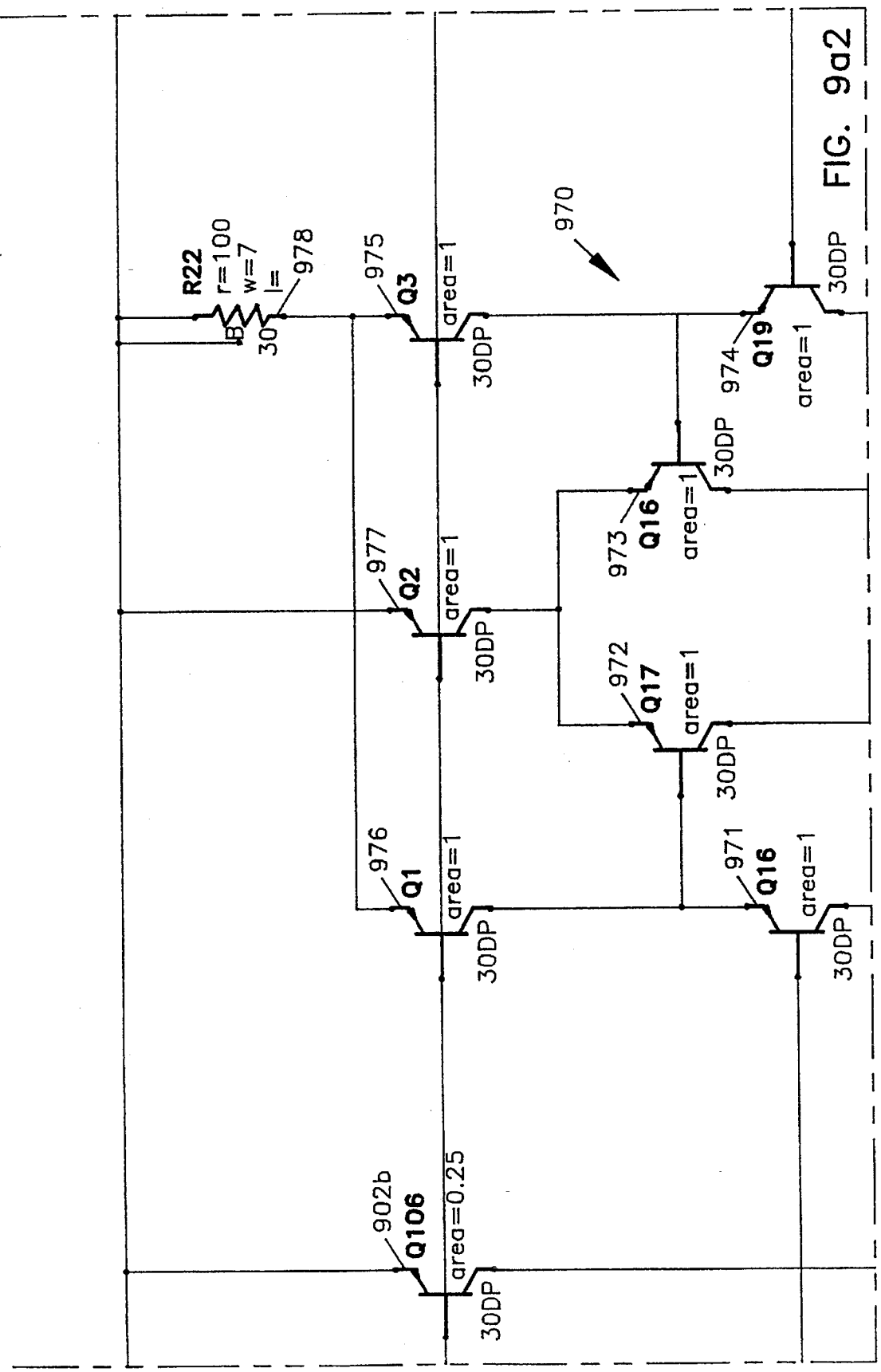
FIG. 9a2

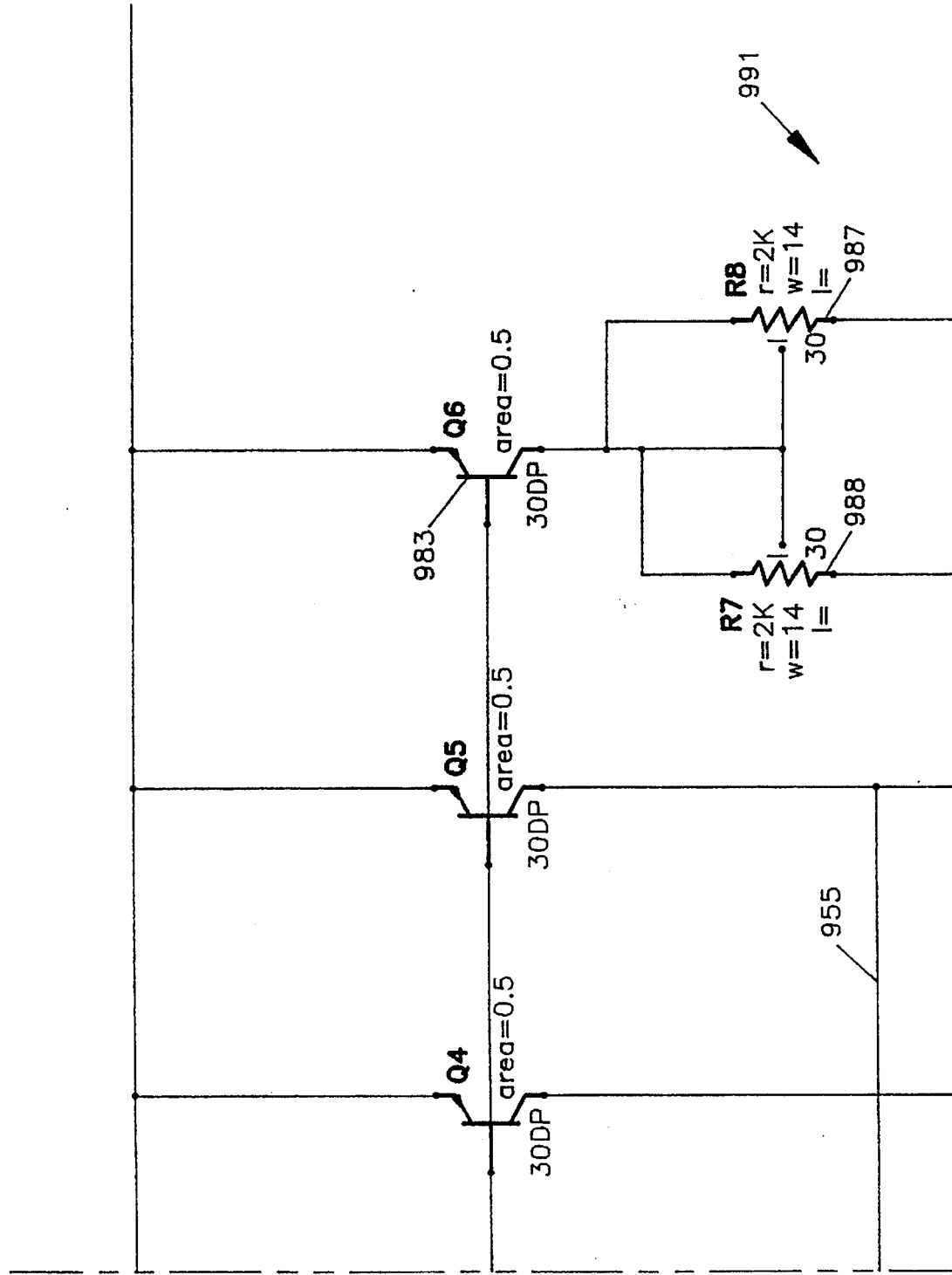
FIG. 9a3

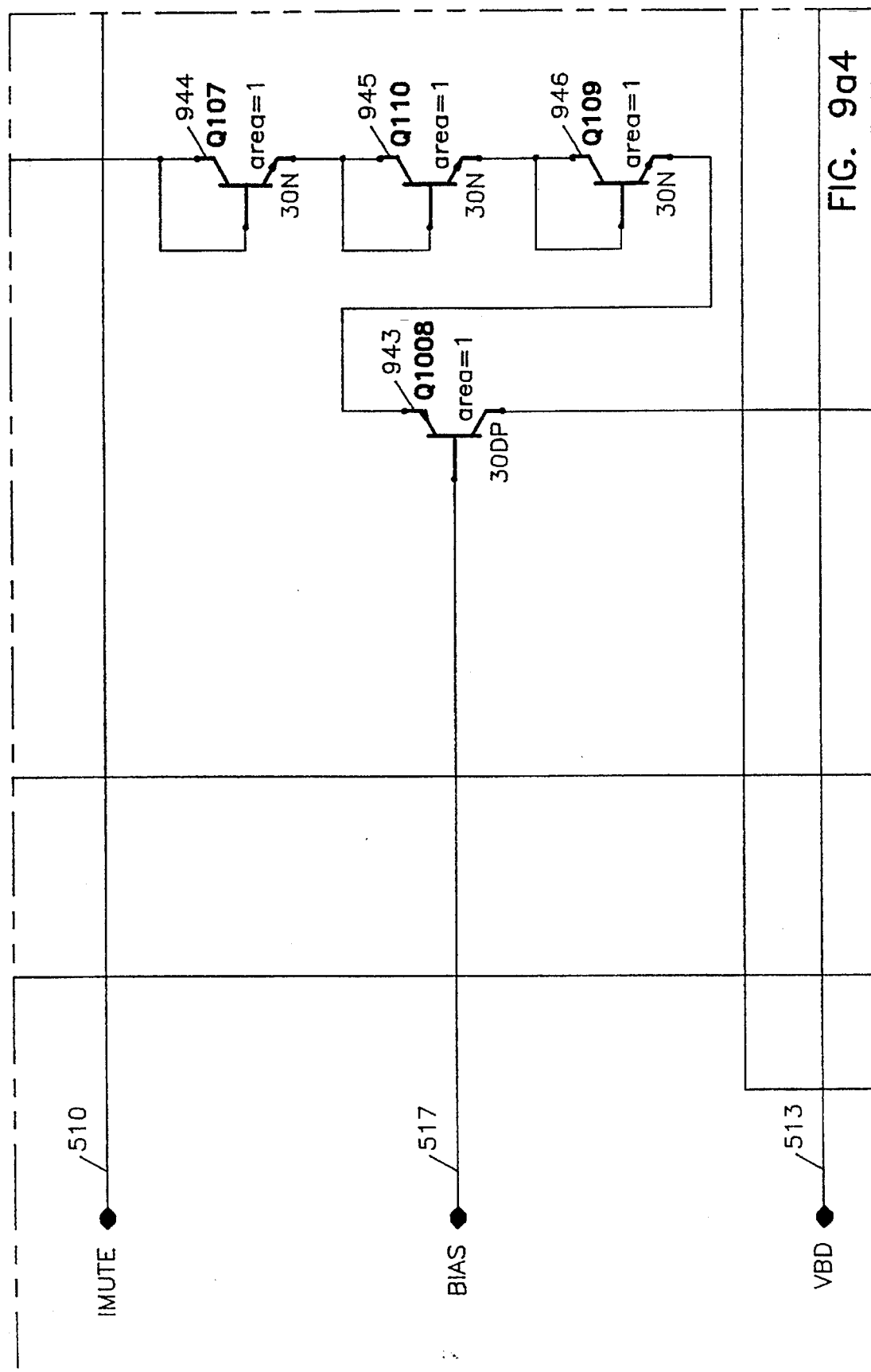
FIG. 9a4

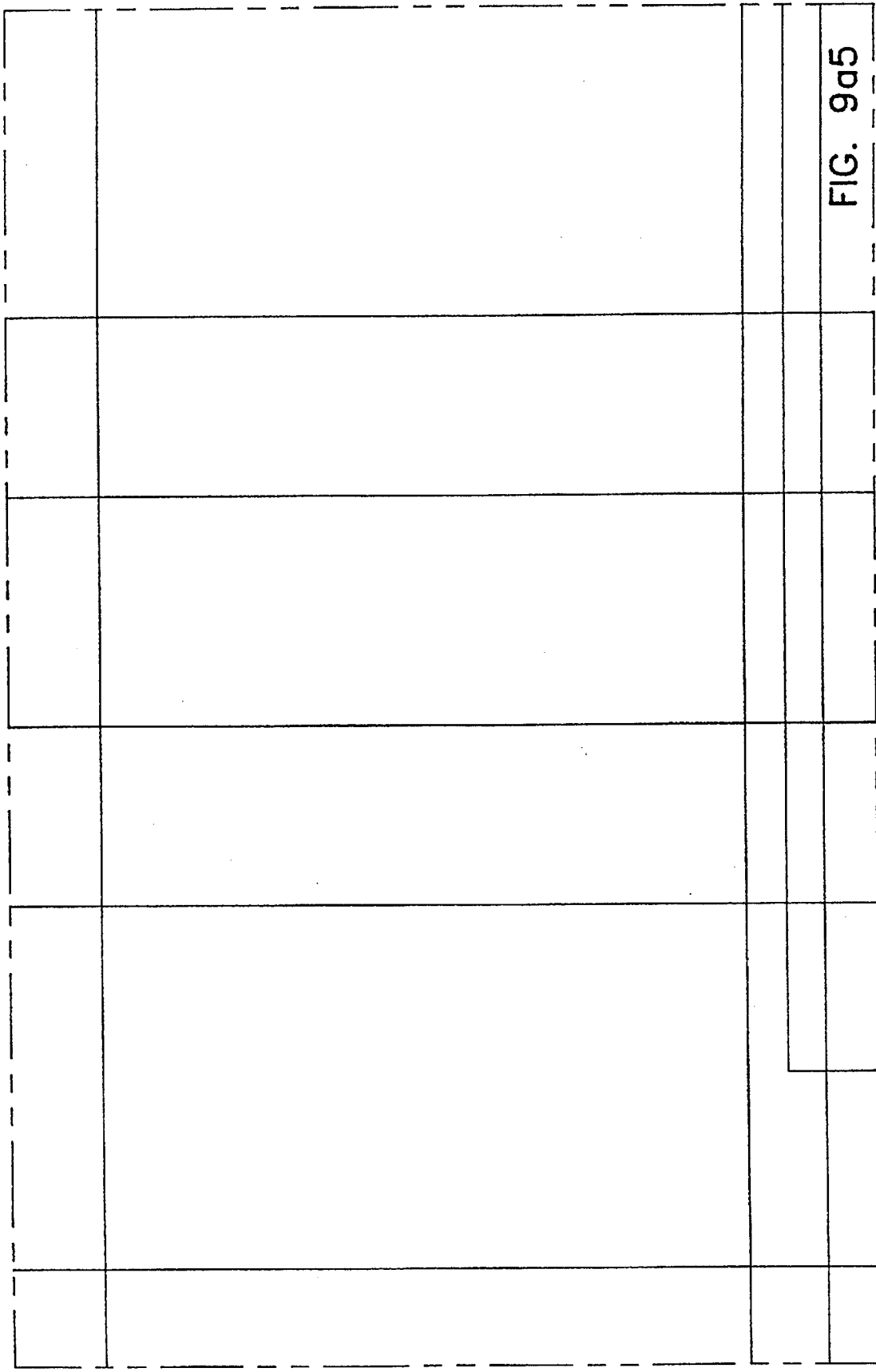
FIG. 9a5

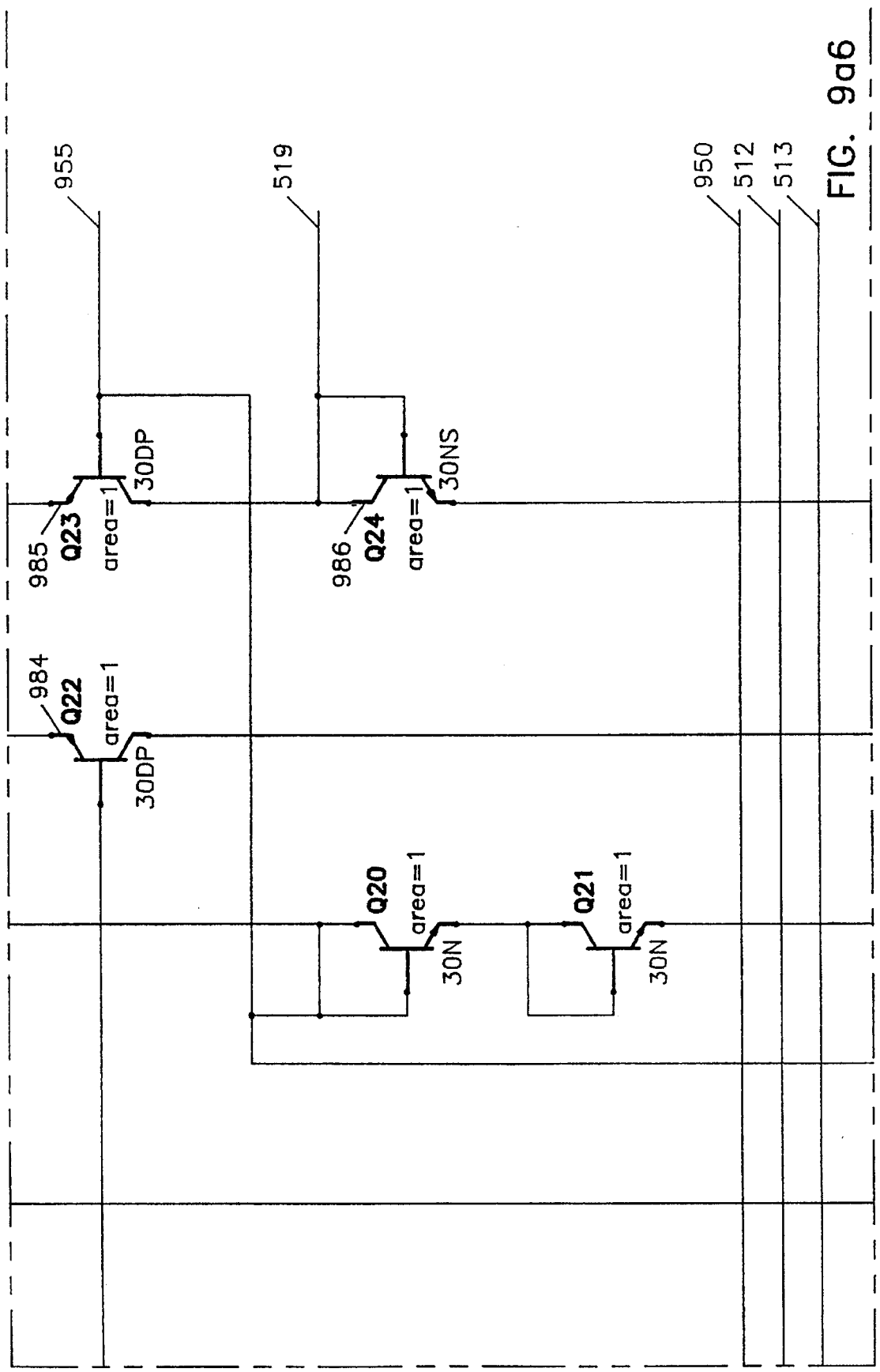
FIG. 9a6

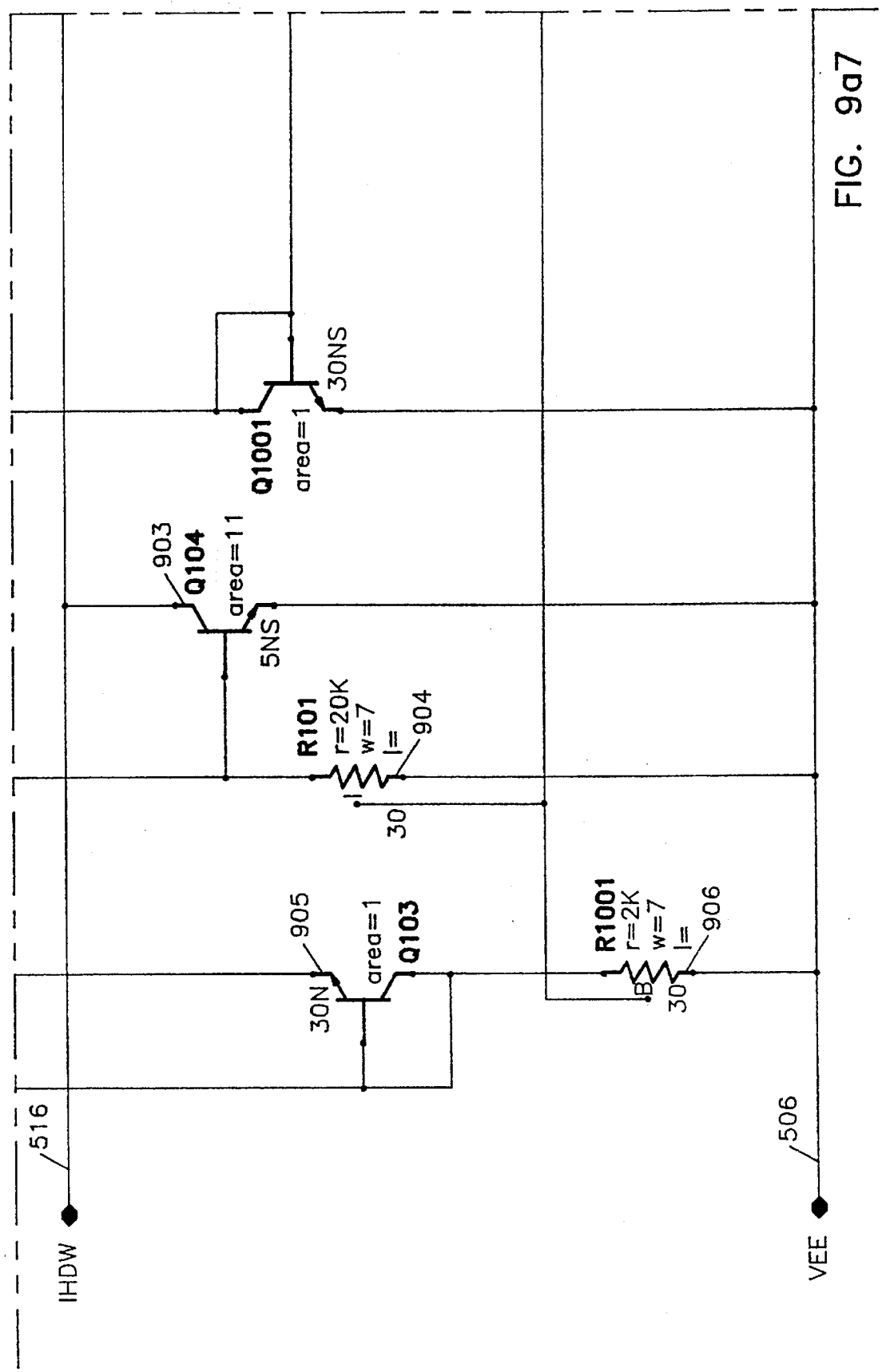
FIG. 9a7

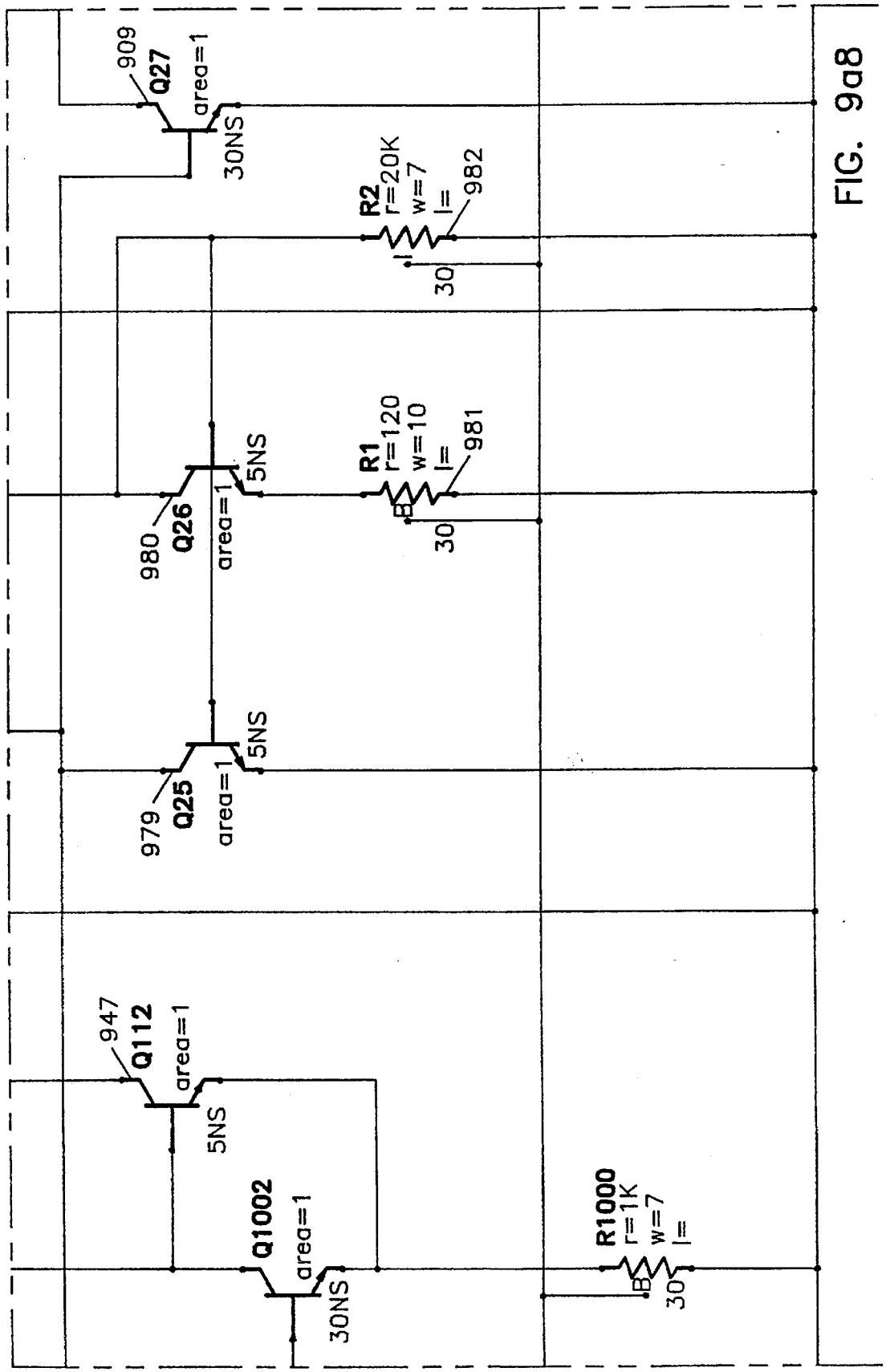
FIG. 9a8

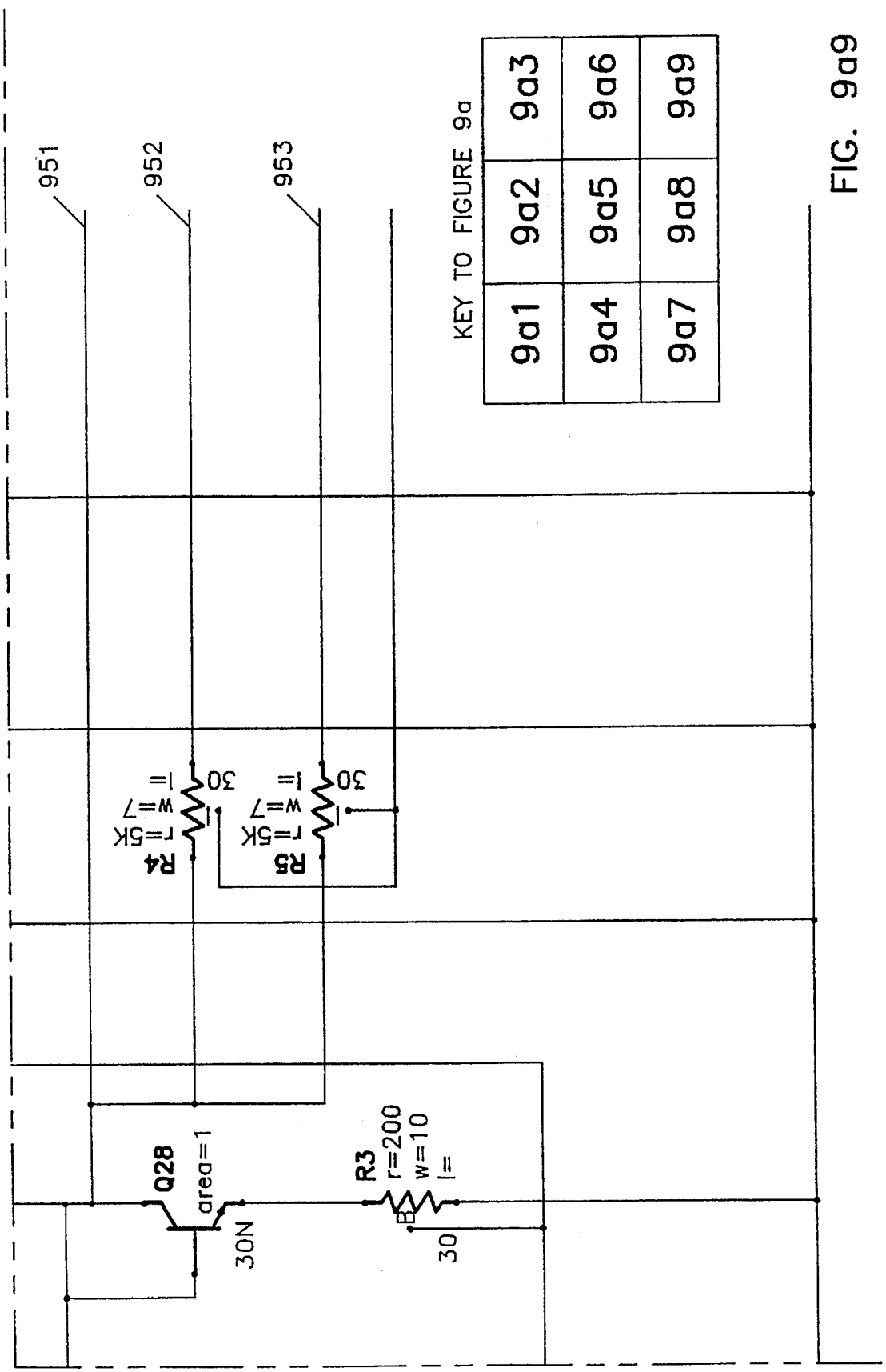
FIG. 9a9

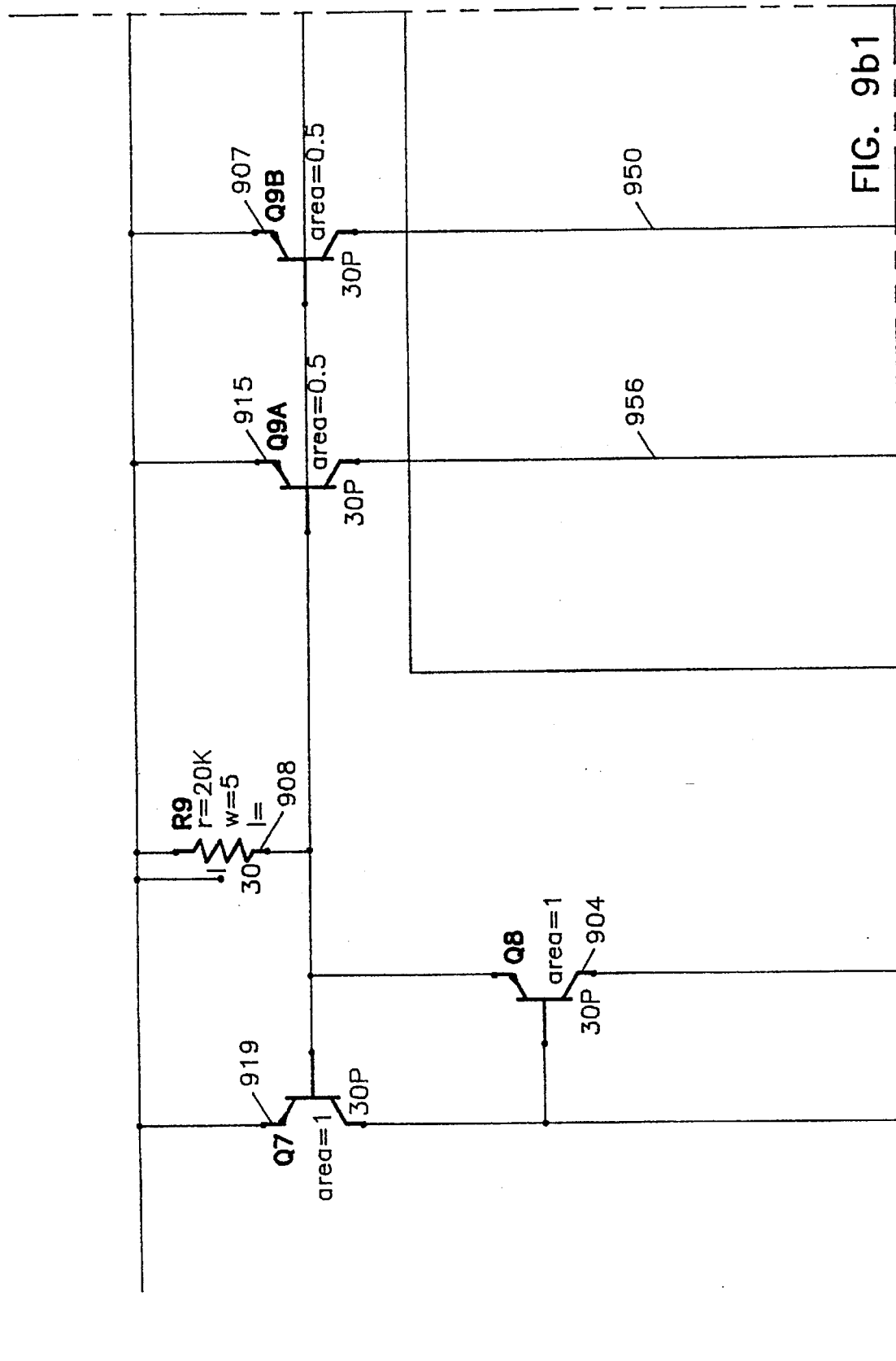
FIG. 9b1

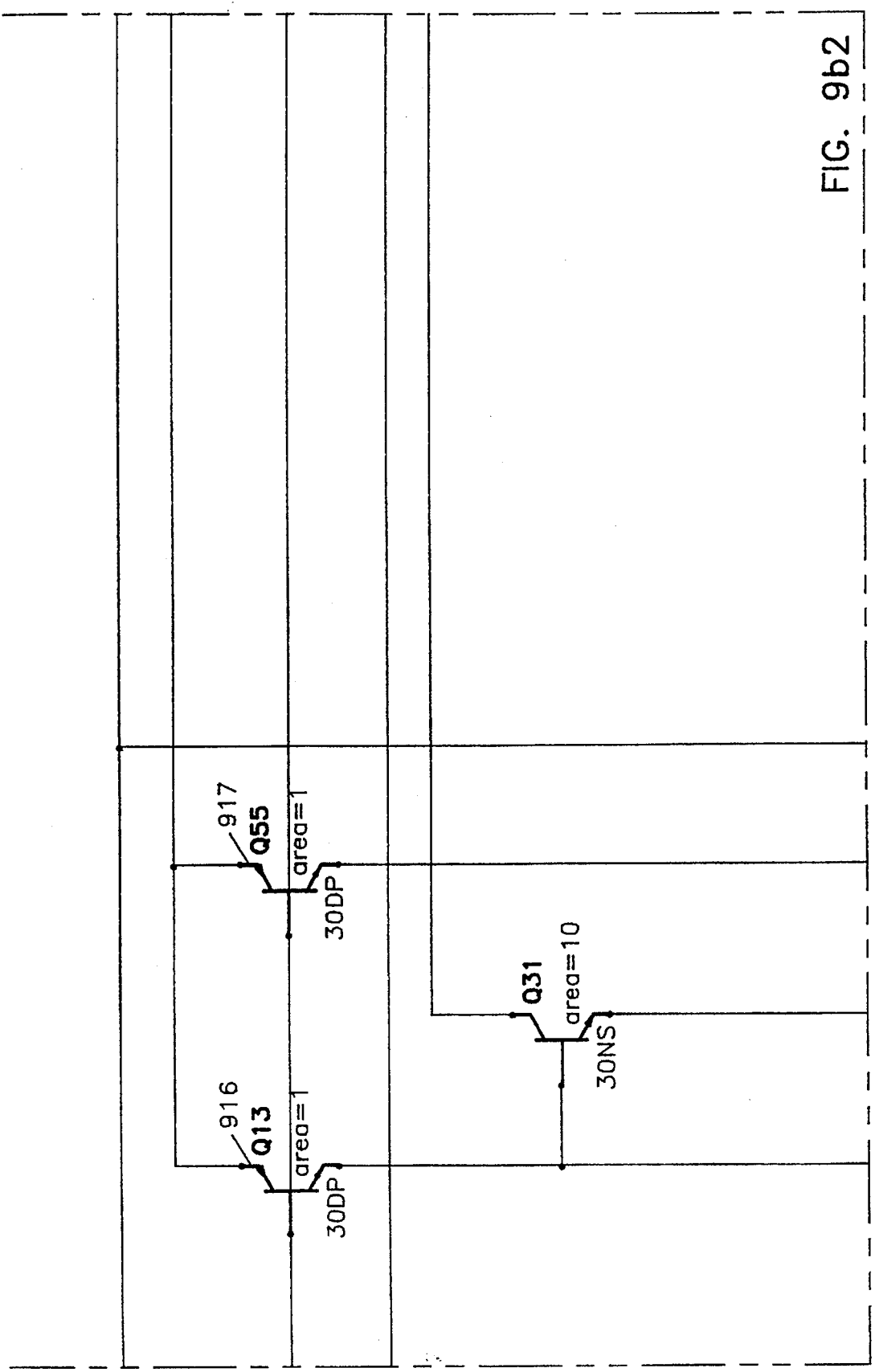

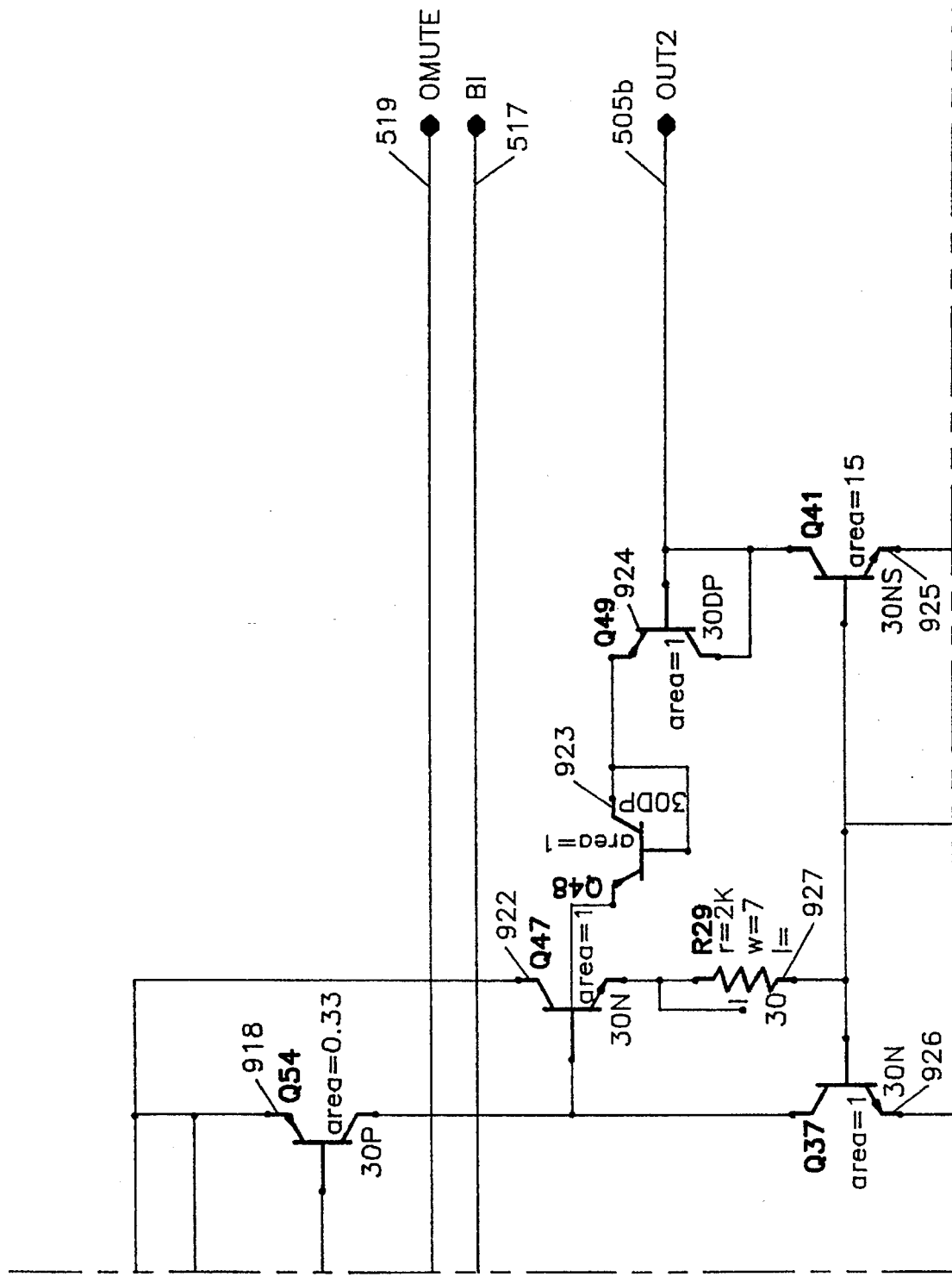
FIG. 9b3

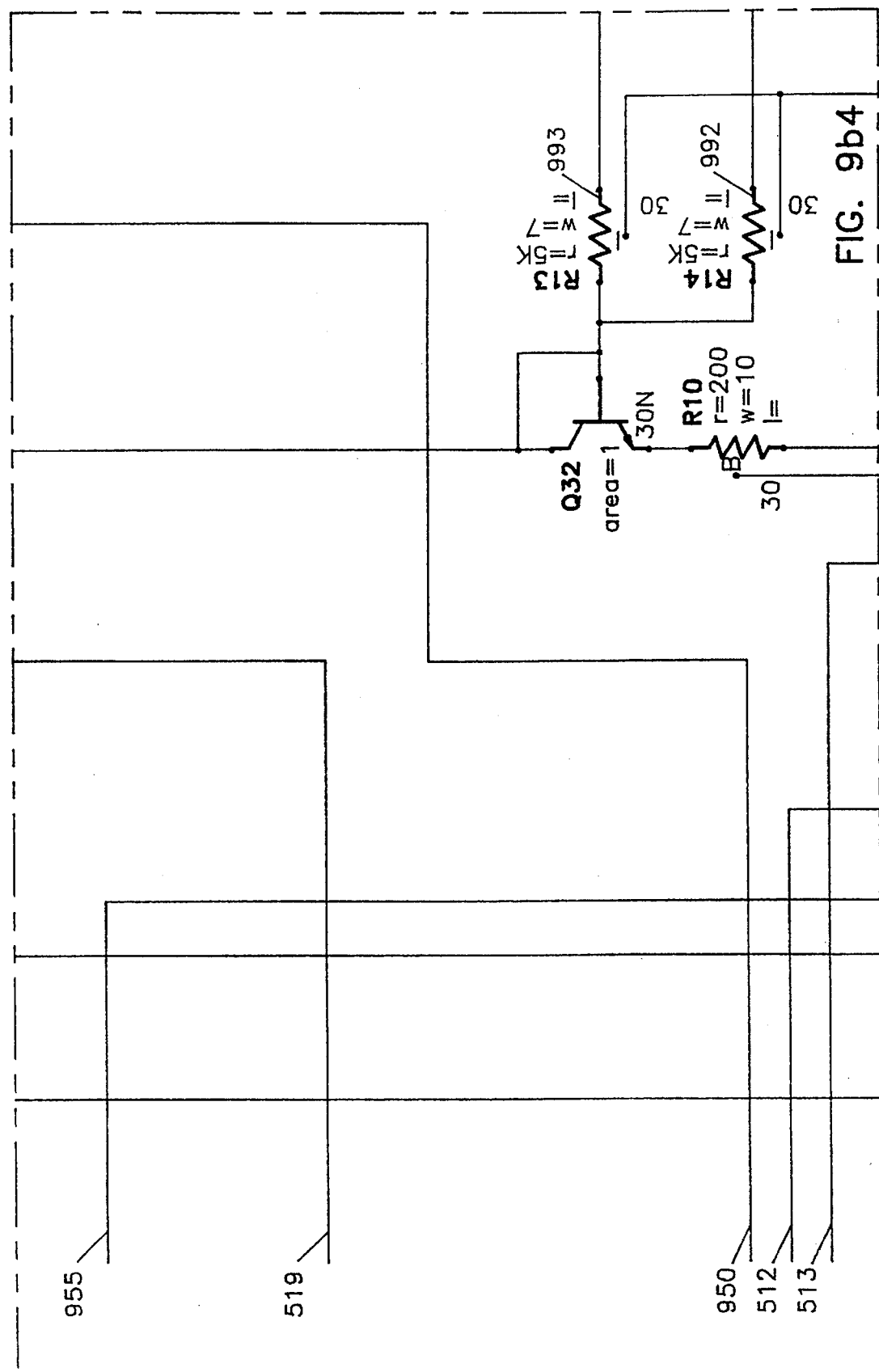
FIG. 9b4

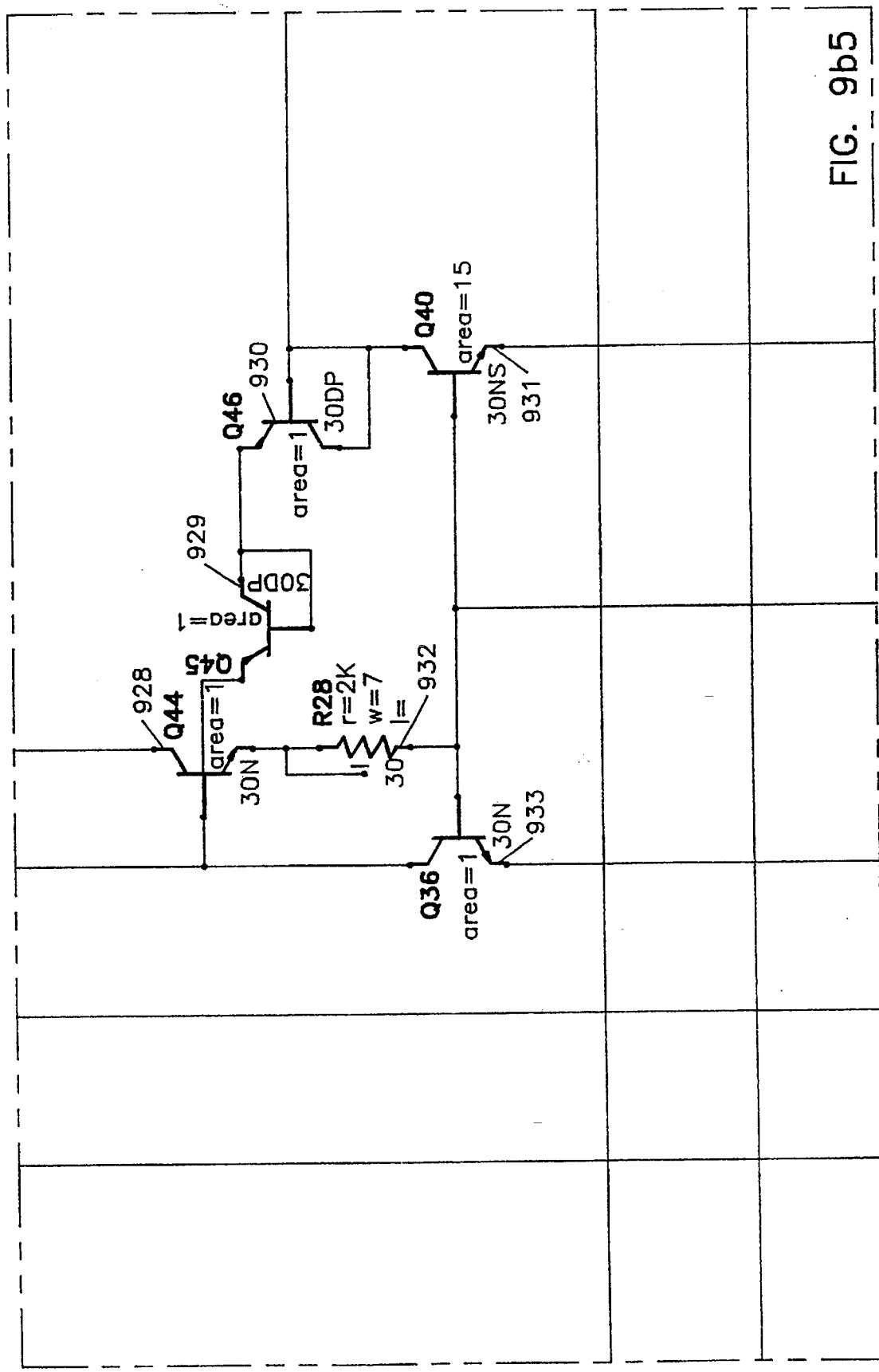
FIG. 9b5

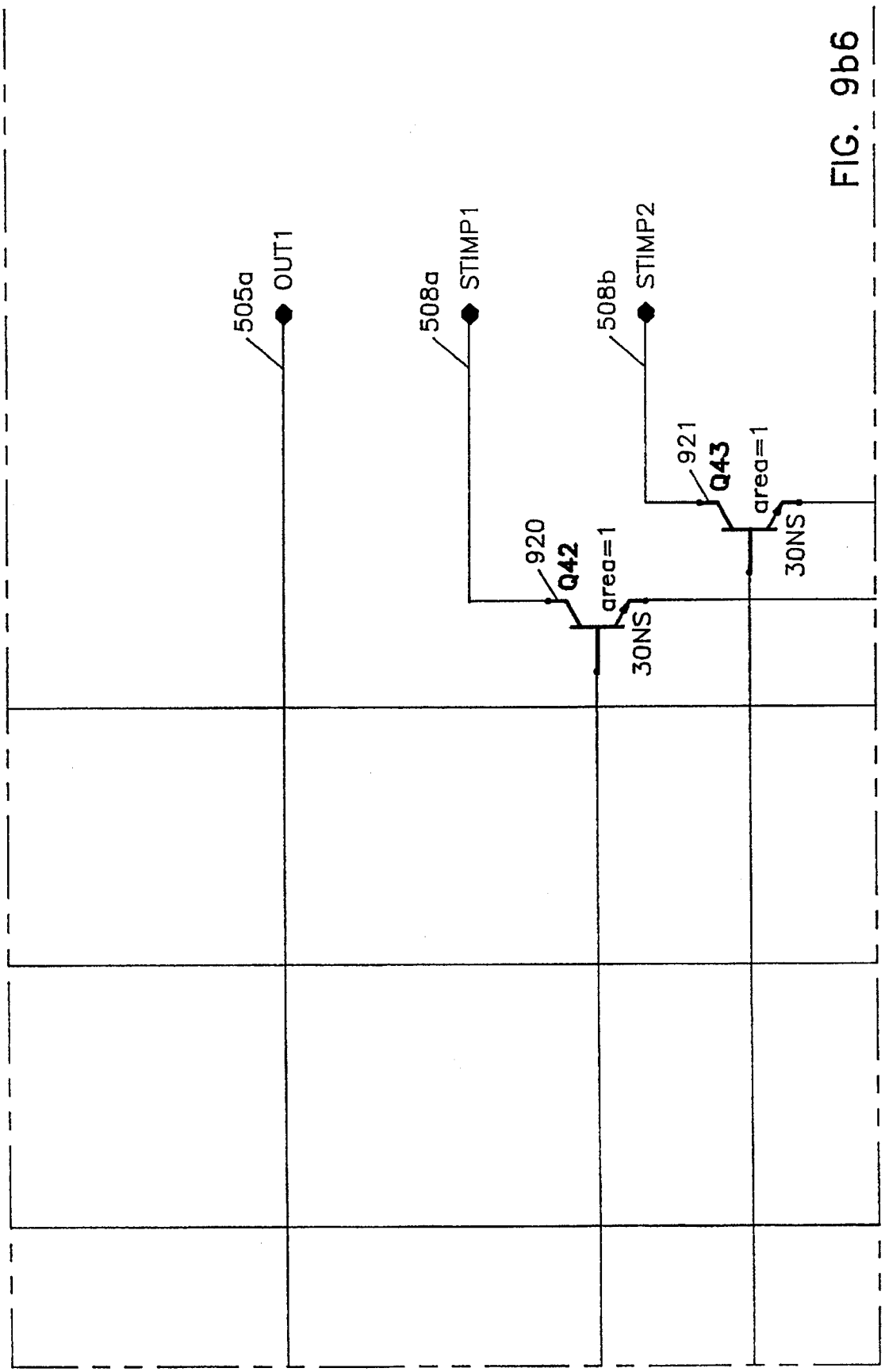
FIG. 9b6

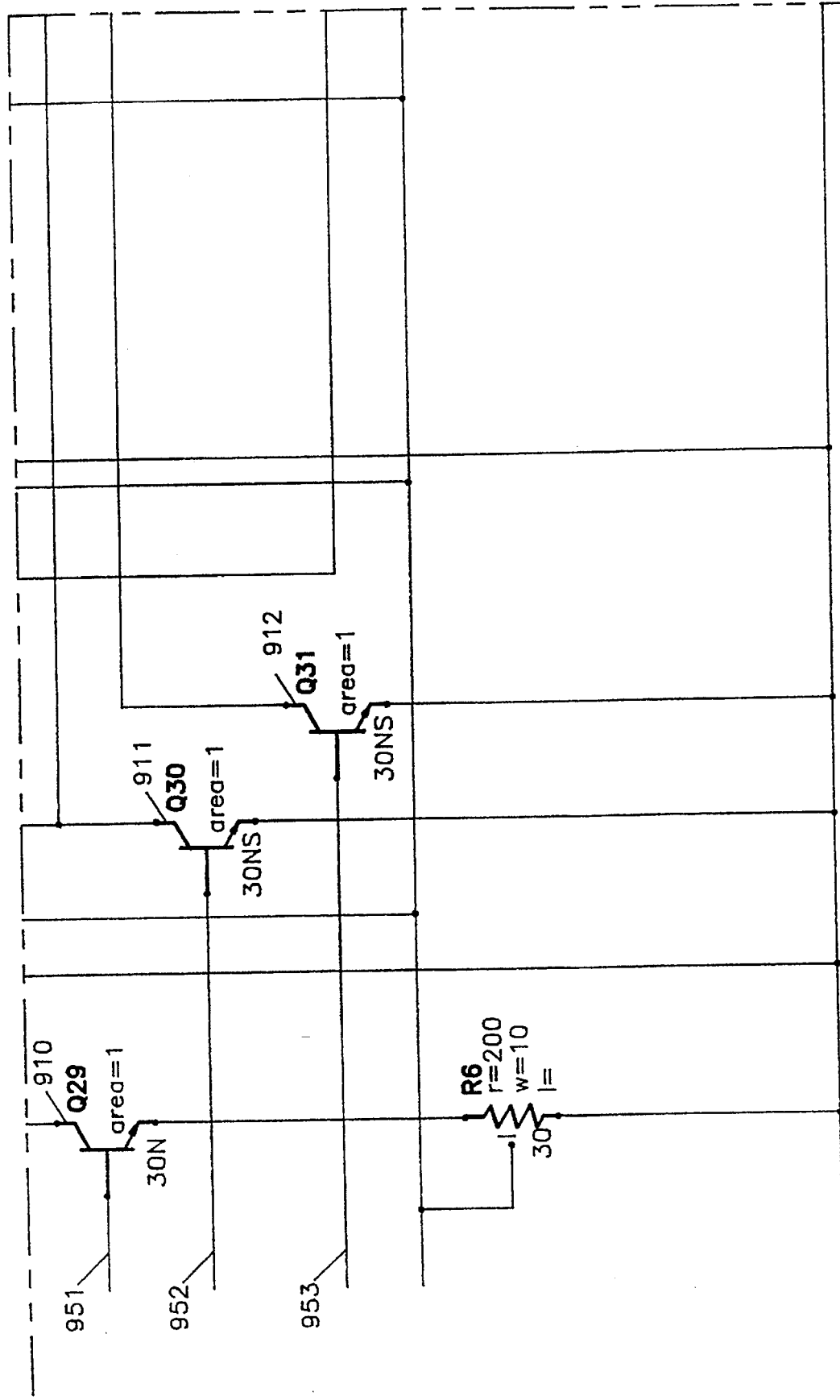
FIG. 9b7

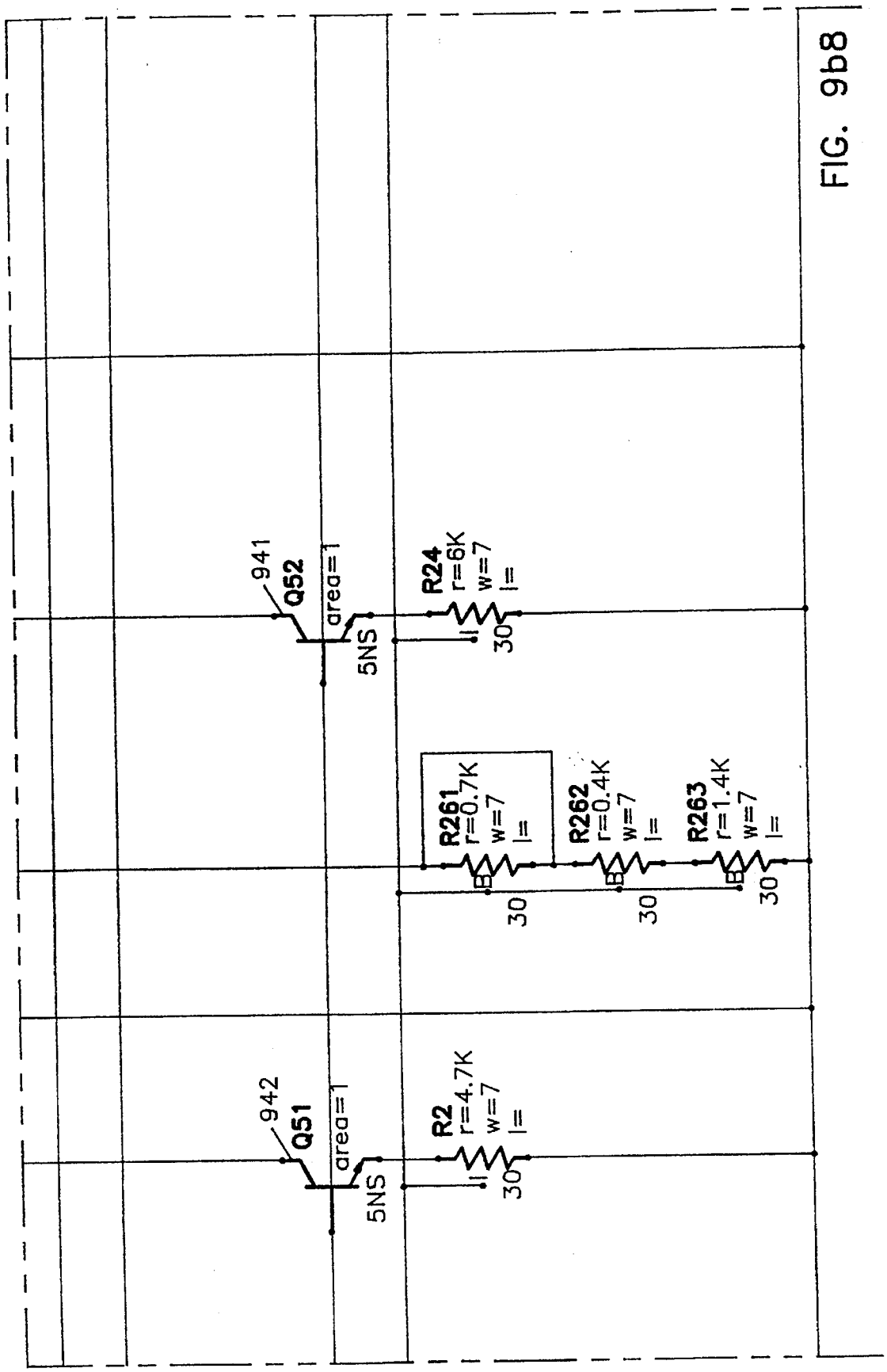
FIG. 9b8

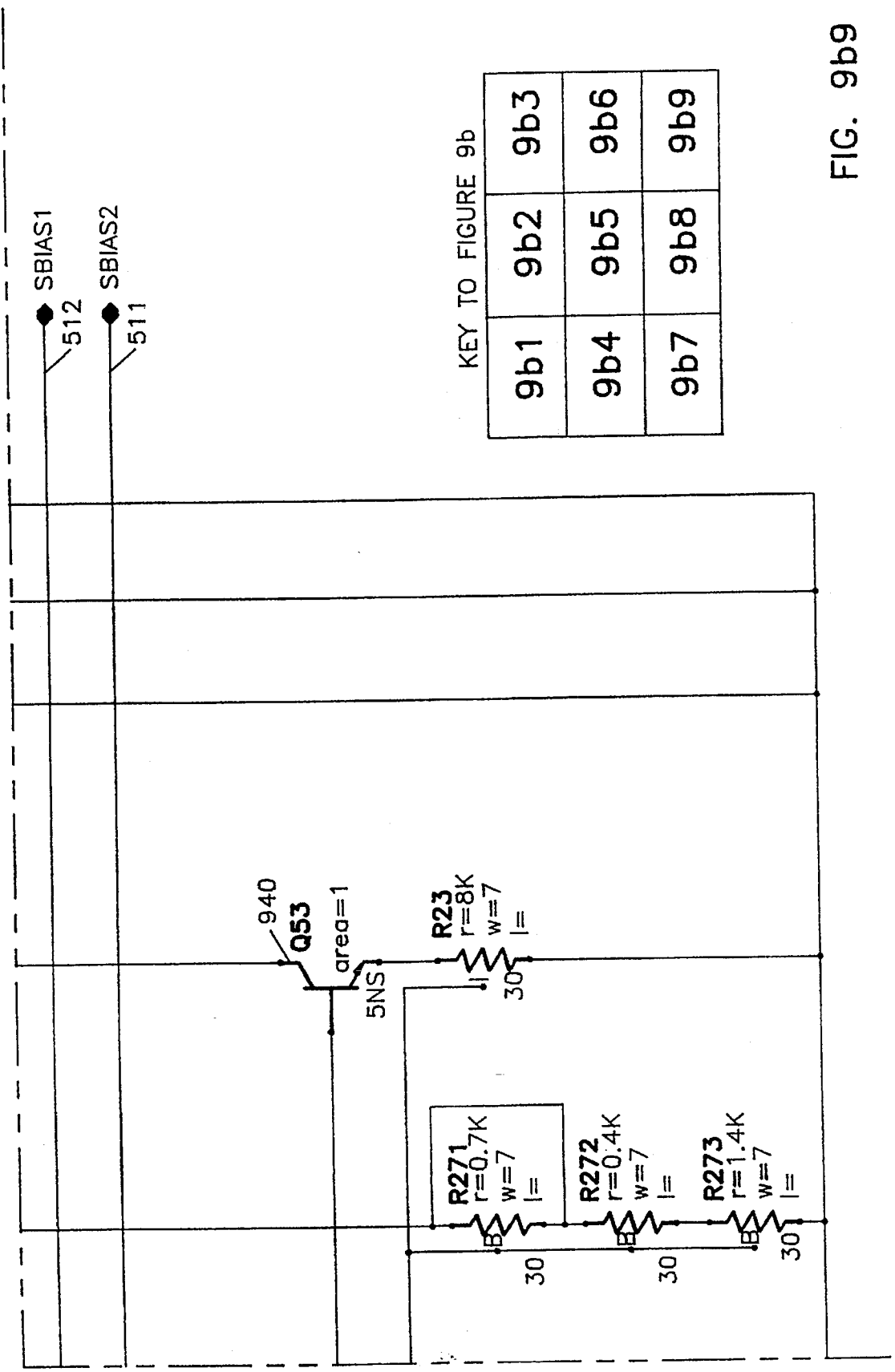
FIG. 9b9

NO TURN-ON POP NOISE AMPLIFIER

BACKGROUND OF THE INVENTION

1. Field of the Invention

The present invention relates to linear integrated circuit designs. In particular, the present invention relates to audio amplifiers having no turn-on pop noise.

2. Discussion of the Related Art

During the power-up phase of an audio amplifier circuit's operation, an abrupt change in the amplifier's output voltage can result in an undesirable "pop" noise. The occurrence of this pop noise is illustrated with reference to FIG. 1, which shows a conventional audio amplifier circuit 100. As shown in FIG. 1, output amplifier circuit 100 includes speaker 101, audio amplifier integrated circuit 140, capacitors 102, 110, 111 and 112, and resistors 103 and 104. An input audio signal is provided at terminal 114, and an output signal of audio amplifier integrated circuit 140 is provided at terminal 117 to drive speaker 101. In FIG. 1, the operation of audio amplifier integrated circuit 140 can be represented by operational amplifier 105, and on-chip resistors 106, 107 and 108.

In audio amplifier circuit 100, the non-inverting input terminal 116 of operational amplifier 105 is biased by a voltage having a value approximately one-half the supply voltage $V_{cc}$. The voltage at non-inverting terminal 116 is provided by the voltage divider formed by resistors 106 and 108. When amplifier circuit 100 is powered-up, input terminal 116 is slowly charged up to the one-half $V_{cc}$ value by the RC filter formed by resistor 107 and capacitor 112. Ideally, the voltage at output terminal 117 of operational amplifier 105 rises smoothly at approximately the same rate as the bias voltage's rise at terminal 116. However, pop noise arises in audio amplifier circuit 100 because of the output circuit of operational amplifier 105.

FIG. 2 shows gain/output stage 200 of operational amplifier 105 of FIG. 1. As shown in FIG. 2, gain/output state 200 of operational amplifier 105 includes input or gain stage 200a and output stage 200b. Input stage 200a is a differential amplifier including input NPN transistors 203 and 204, current source 208, bias circuit 207, and output transistor 206. In input stage 200a, a differential voltage is received across terminals 201 and 202, and an amplified non-inverting output signal is provided at terminal 205. The signal at terminal 205 can be directly provided to output stage 200b, to control NPN transistor 218 which, in turn, controls PNP transistor 214 and NPN transistors 215 and 216. When a positive differential voltage is imposed across input terminals 201 and 202, NPN transistor 218 is turned on, pulling the base of PNP transistor 214 towards ground (i.e. supply voltage $V_{EE}$), thereby providing base currents to NPN transistors 215 and 216 to pull output node 207 towards supply voltage $V_{cc}$. The current in NPN transistor 218 is provided by current source 211 through NPN transistor Resistors 209 and 210, which is maintained in the "on" state and current limited by the voltage divider of resistors 209 and 210. Conversely, when a negative differential signal is imposed across input terminals 201 and 202, the output voltage at terminal 205 reduces the current in NPN transistor 218, which in turn pulls output node 217 towards $V_{cc}$, as a result of the current in NPN transistors 212 and 213.

Output stage 200b, however, causes a pop noise during the power-up phase. The pop noise is caused because, when NPN transistors 215 and 216 switches on, upon the power-up phase, the voltage at output terminal 217 jumps abruptly from 0 volts ($V_{EE}$) to the voltage corresponding to the sum of (i) the collector-emitter voltage ($V_{CE}$) of NPN transistor 215, (ii) the base-emitter voltage ($V_{BE}$) of NPN transistor 215, and $V_{BE}$ of NPN transistor 216. This voltage sum is approximately 1.4 volts. Pop noises are observed to occur for an abrupt voltage jump of 100 millivolts. Further, because NPN transistors 215 and 216 switches off when the voltage at output node 217 falls below 1.4 volts, the voltage swing of output terminal 217 is limited the low voltage end at 1.4 volts.

Input stage 200a of operational amplifier 105 is further limited because the differential amplifier of input stage 200a cannot start up from a zero common mode input voltage across input terminals 201 and 202. At a common mode zero volts input, both NPN transistors 203 and 204 are in the off-state.

There is an additional source of turn-on pop noise in audio amplifier 100 of FIG. 1. If power to audio amplifier 100 is switched off momentarily, but power is returned before capacitors 102, 110, 111 and 112[1] are fully discharged, the remaining charge in any of capacitor 102, 110, 111 and 112 may cause a surge in voltage at output terminal 117, leading to pop noise.

[1] Capacitor 102 is a blocking capacitor for filtering out a DC component of the output signal at terminal 117. Capacitor 111 adjusts the gain of operational amplifier 105. Capacitor 112 prevents high frequency noise in the bias voltage at terminal 116. Capacitor 110 is a blocking capacitor for filtering out a DC component of the input signal at terminal 114.

SUMMARY OF THE INVENTION

The present invention provides an audio amplifier having one or more of the following features: (i) an input stage which operates under zero common-mode input voltage, (ii) an output stage which provides the low voltage end of its voltage swing very close to ground voltage, and (iii) a system of shunt circuits for discharging external capacitors, so as to prevent, upon subsequent power-up, pop noises due to residue charges in the external capacitors.

In accordance with one aspect of the present invention, an input stage for an audio amplifier circuit includes a differential amplifier having a first input transistor and a second input transistor coupled to receive a differential input signal, both the first and second transistors being in a conducting state when the differential input signal is a substantially zero volts common mode signal. In one embodiment of the present invention, the first and second input transistors are implemented by PNP transistors. Further, the differential amplifier includes (i) a current source; (ii) a first PNP transistor having an emitter terminal coupled to the current source and a base terminal coupled to an emitter terminal of the input transistor; (iii) a second PNP transistor having an emitter terminal coupled to the current source and a base terminal coupled to an emitter terminal of the second input transistor; and (iv) an output terminal coupled to a collector terminal of the second PNP transistor.

In accordance with another aspect of the present invention, an output stage for an audio amplifier circuit includes (i) a pull-up circuit for coupling the output terminal to a supply voltage source, the pull-up circuit providing a first current having a magnitude controlled by the voltage of an input audio signal of the output stage; (ii) a pull-down circuit, receiving a pull-down signal, for coupling the output terminal to ground voltage, the pull-down circuit providing a second current having a magnitude controlled by the voltage of the pull-down signal, and the pull-down circuit includes a transistor coupled between the output terminal and the ground voltage, such that, when the transistor is a conducting state, the voltage difference between the output terminal and the ground voltage is less than a forward-biased PN junction; and (iii) a differential amplifier, coupled to receive the input signal and the output signal of the output stage, for providing the pull-down signal in accordance with the difference in voltage between the output signal and the input signal.

In one embodiment of the present invention, the output stage is coupled to a bias circuit for biasing the output terminal of the output stage to a predetermined bias voltage, which is designed to be substantially to one-half the supply voltage. In that embodiment, the differential amplifier is coupled to the output terminal of the output stage by either a resistor or one or more diodes.

In accordance with another aspect of the present invention, an audio amplifier circuit includes: (i) an audio amplifier coupled to receive a first input signal and a second input signal at a first input terminal and a second input terminal respectively, and providing an output signal at an output terminal coupled to an audio speaker, the first input signal being the sum of an audio signal and a predetermined bias voltage received at a third input terminal, and the second input signal being a feedback signal derived from the output signal; (ii) a comparator receiving a reference voltage and a supply voltage for providing a control signal indicating whether the reference voltage is higher than the supply voltage; and (iii) a first controlled current source, a second controlled current source and a third controlled current source, each current source receiving the control signal, for discharging, respectively, the second input terminal, the third input terminal and the output terminal in response to the control signal indicating the supply voltage is lower than the reference voltage.

In one embodiment, the comparator includes a first peripheral collector transistor having a first collector terminal and a second collector terminal, the peripheral collector transistor being provided in a configuration in which a current flows in the first collector terminal when the supply voltage is higher than the reference voltage, and a second current flows in the second collector terminal when the supply voltage is lower than the reference voltage.

In that embodiment, the second controlled current source is provided a second control signal which, when asserted, causes the second controlled current source to discharge the third terminal (i.e. the bias voltage) when the second control signal is asserted. In that configuration, a second comparator circuit compares the supply voltage to a second reference voltage source and asserts the second control signal when the second reference voltage is higher than the supply voltage. The second reference voltage in that instance is selected to be between the bias voltage and the first reference voltage.

The present invention is better understood upon consideration of the detailed description below and the accompanying drawings.

BRIEF DESCRIPTION OF THE DRAWINGS

FIGS. 9a and 9b are respectively a first part and a second part of a schematic circuit showing control circuit 521 in audio amplifier integrated circuit 500 of FIG. 5.

FIG. 10 shows the structure and operation of voltage source 405, as implemented by transistor 901 of FIG. 9a.

DETAILED DESCRIPTION OF THE PREFERRED EMBODIMENTS

The present invention provides an audio amplifier having one or more of the following features: (i) an input stage which operates under zero common-mode input voltage, (ii) an output stage which provides the low voltage end of its voltage swing very close to ground voltage, and (iii) a system of shunt circuits for discharging external capacitors, so as to prevent, upon subsequent power-up, pop noises due to residue charges in the external capacitors.

Figure 3:
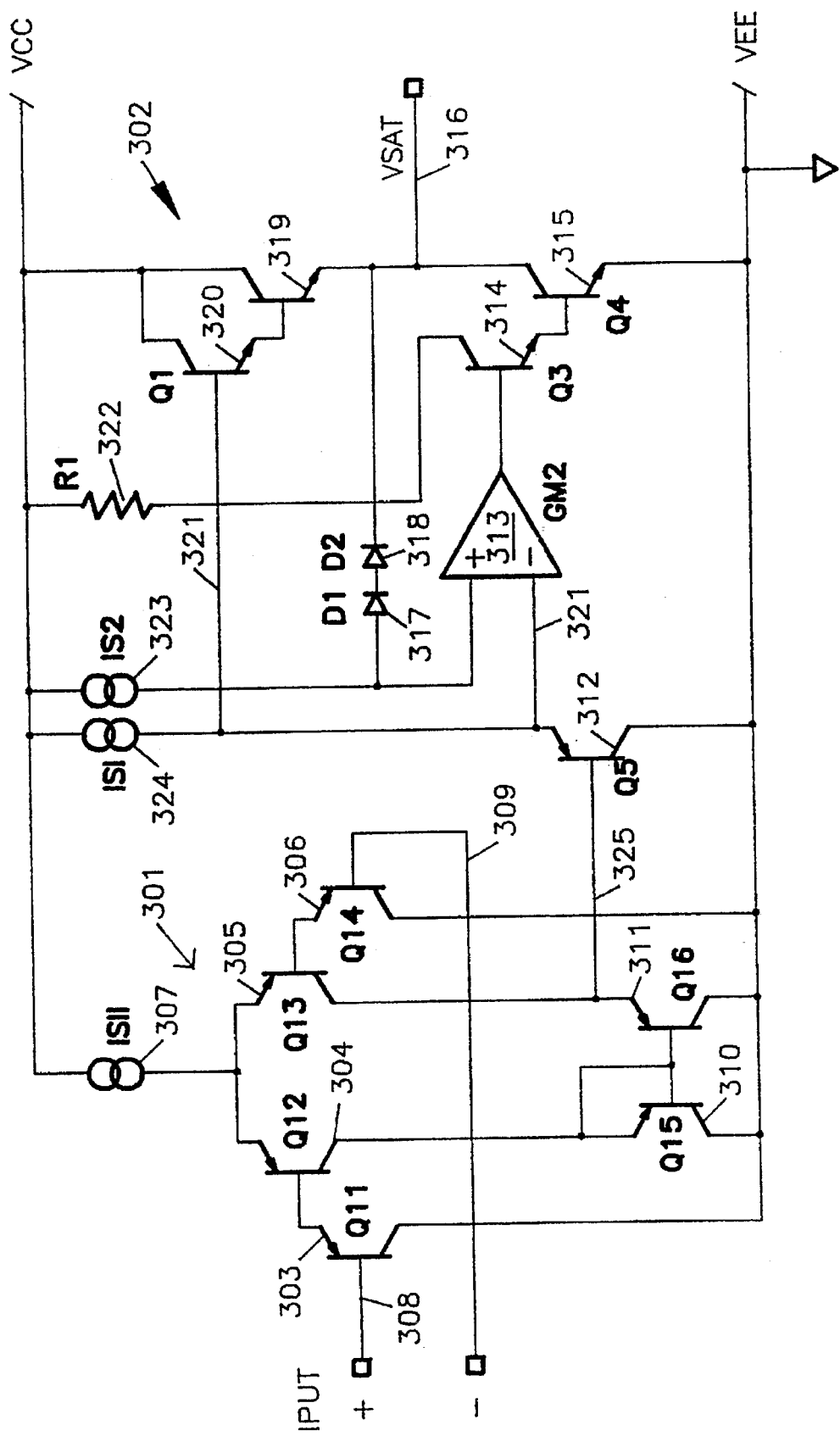
FIG. 3 shows input stage 301 and output stage 302 of an audio amplifier of the present invention.

Input stage 301 and output stage 302 of an audio amplifier of the present invention are illustrated in FIG. 3. As shown in FIG. 3, input stage 301 includes PNP transistors 303, 304, 305 and 306, current source 307 and NPN transistors 310 and 311. PNP transistors 303, 304, 305 and 306 are input transistors configured as two Darlington pairs to receive a differential voltage across terminals 308 and 309. Non-inverting output signal 325 is tapped from the collector terminal of NPN transistor 311. When the voltage at terminal 308 is higher than the voltage at terminal 309, the current in PNP transistor 305 is larger than the corresponding current in PNP transistor 304, such that the voltage at terminal 325 is pulled towards supply voltage $V_{CC}$. Conversely, when the voltage at terminal 308 is lower than the voltage at terminal 309, the current in PNP transistor 305 is smaller than the corresponding current in PNP transistor 304, such that the voltage at terminal 325 is pulled towards supply voltage $V_{EE}$.

Figure 2:
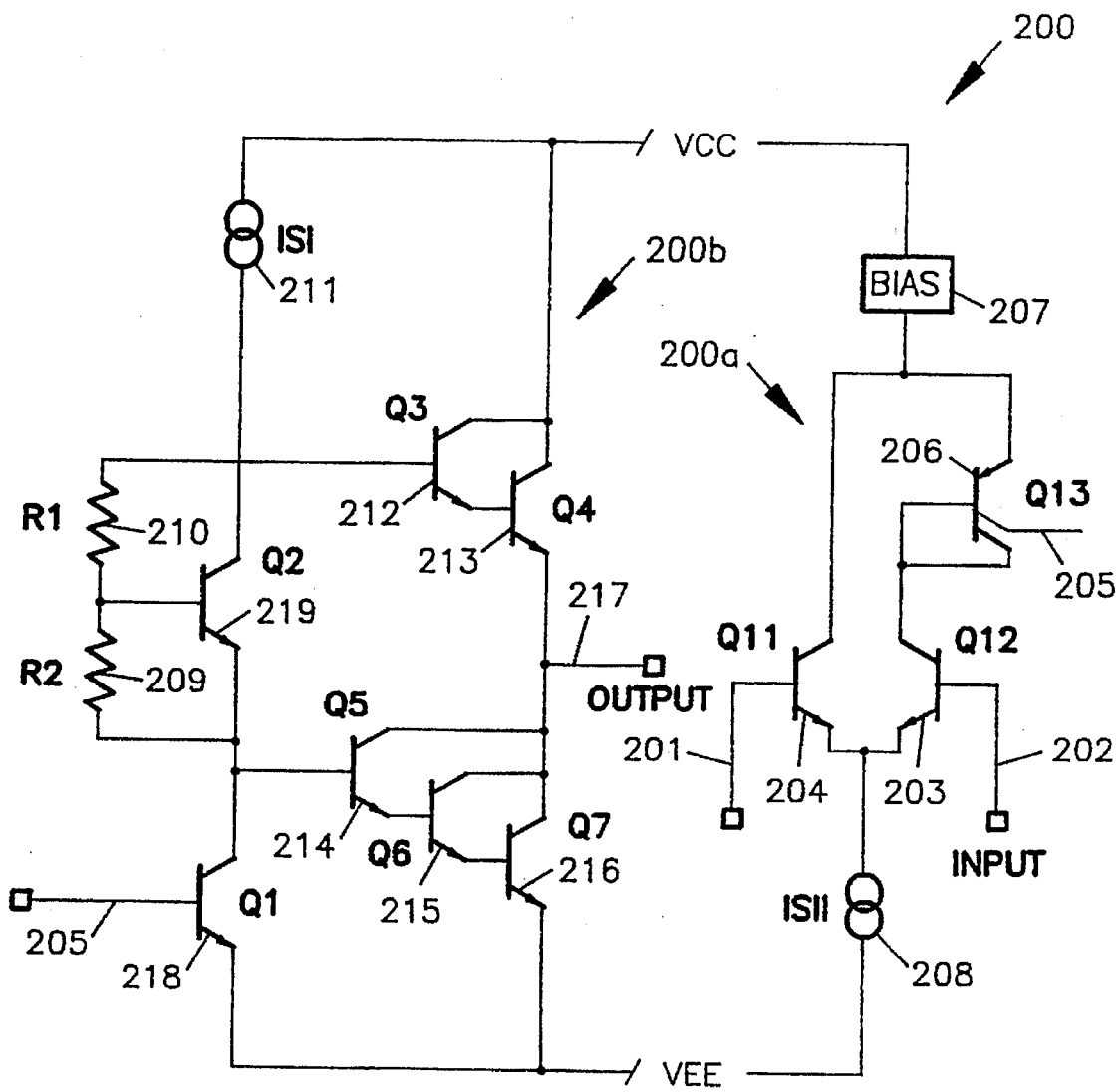
FIG. 2 shows gain/output stage 200 of operational amplifier 105 of FIG. 1.

Input stage 301 operates for any common mode voltage between 0 volts to two $V_{BE}$'S below supply voltage $V_{CC}$, when PNP transistors 303, 304, 305 and 306 shut off. In particular, when a common mode voltage of zero volts is imposed across terminals 308 and 309, as occurs during the power-up phase, when $V_{CC}$ rises above approximately two $V_{BE}$'S, PNP transistors 303, 304, 305 and 306 switch to the "on" state. Thus, unlike input stage 200b of FIG. 2, input stage 301 operates at zero common mode voltage input.

The output voltage at terminal 325 is provided as an input signal to output stage 302. Specifically, terminal 325 is coupled to the base terminal of NPN transistor 312, whose collector terminal 325 is coupled to the inverting input terminal of amplifier 313, and the base terminal of output NPN transistor 320. Output stage 302 is an A-B biased type output circuit including NPN transistors 314, 315, 319 and 320 (configured as two Darlington pairs), a differential amplifier 313, diodes 317 and 318, resistor 322, and current sources 323 and 324.

As shown in FIG. 3, when the voltage of output terminal 325 is pulled towards supply voltage $V_{EE}$, the current in NPN transistor 312 is reduced, thereby pulling the voltage at terminal 321 towards supply voltage $V_{CC}$. Consequently, the emitter currents in PNP transistors 320 and 319 are increased, thereby pulling the output voltage of output terminal 316 towards supply voltage $V_{CC}$. Conversely, when the voltage of output terminal 325 is pulled towards supply voltage $V_{CC}$, the current in NPN transistor 312 is increased, thereby pulling the voltage at terminal 321 towards ground (i.e. supply voltage $V_{EE}$). In response to the decreased voltage at terminal 321, which is coupled to differential amplifier 313's inverting input terminal, differential amplifier 313 provides an increased current at NPN transistors 314 and 315, thereby pulling the output voltage at output terminal 316 towards ground. Under this configuration, since the output voltage at output terminal is only limited by collector-emitter voltage ($V_{CE}$) of NPN transistor 315, by suitably sizing output transistor 315, the low end of the voltage swing at output terminal 316 can be made very close to ground voltage (e.g. 100 mV).

Initially, during the power up phase, the output voltage at output terminal 316 is substantially at zero volts. Since NPN transistors 314 and 315 do not switch on until the voltage at the base terminal of NPN transistor 314 reaches two $V_{BE}$'S above ground, diodes 317 and 318 are provided to allow the output voltage to rise with $V_{cc}$ at output terminal 316 until NPN transistors 314 and 315 turn on. Thereafter, the output voltage on output terminal 316 follows the rise in bias voltage at input terminals 308 and 309. Since the voltage swing at output terminal 316 can be made very close to zero, there is no abrupt jump in the output terminal 316, thereby avoiding pop noise.

Figure 1:
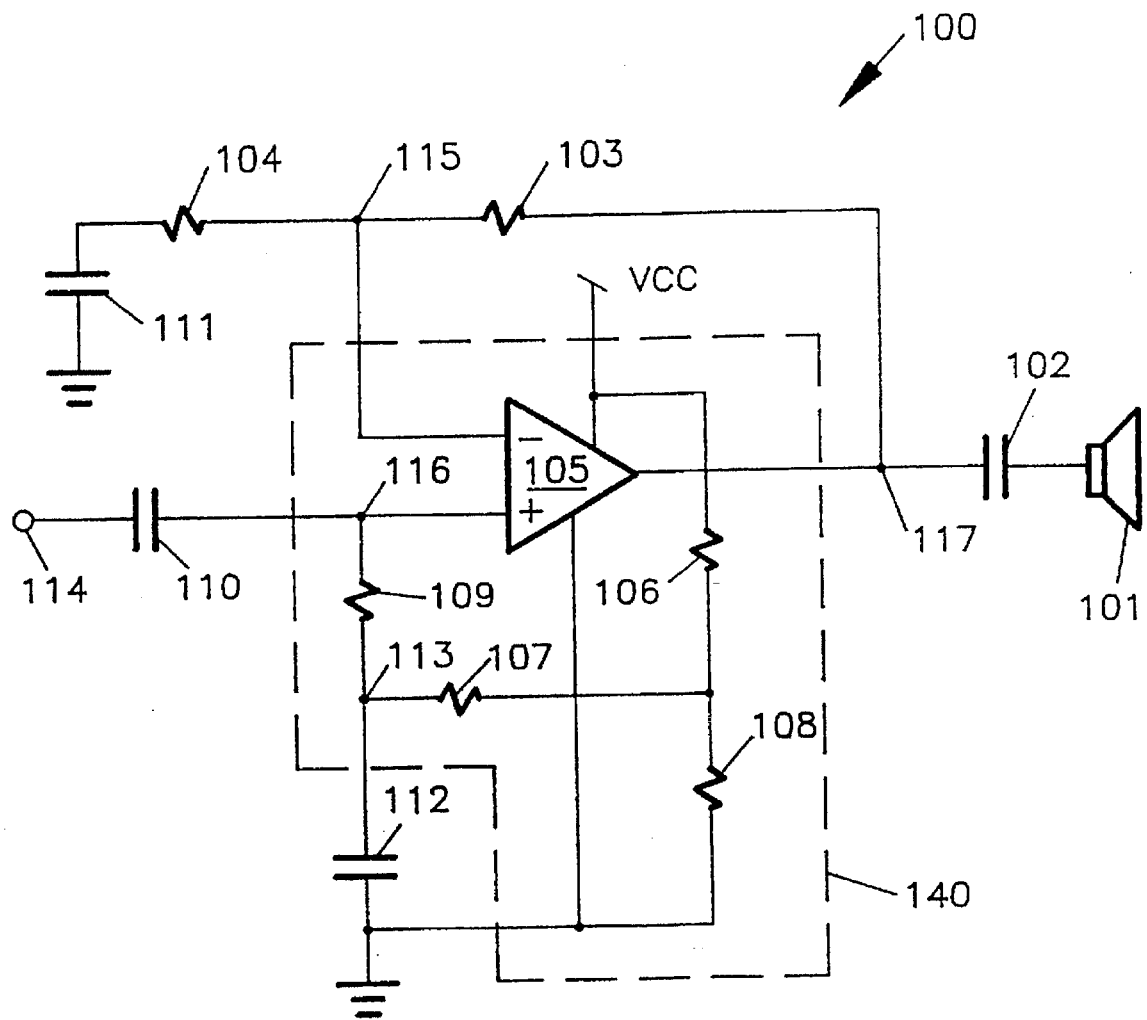
FIG. 1 shows a conventional audio amplifier circuit 100.
Figure 4:
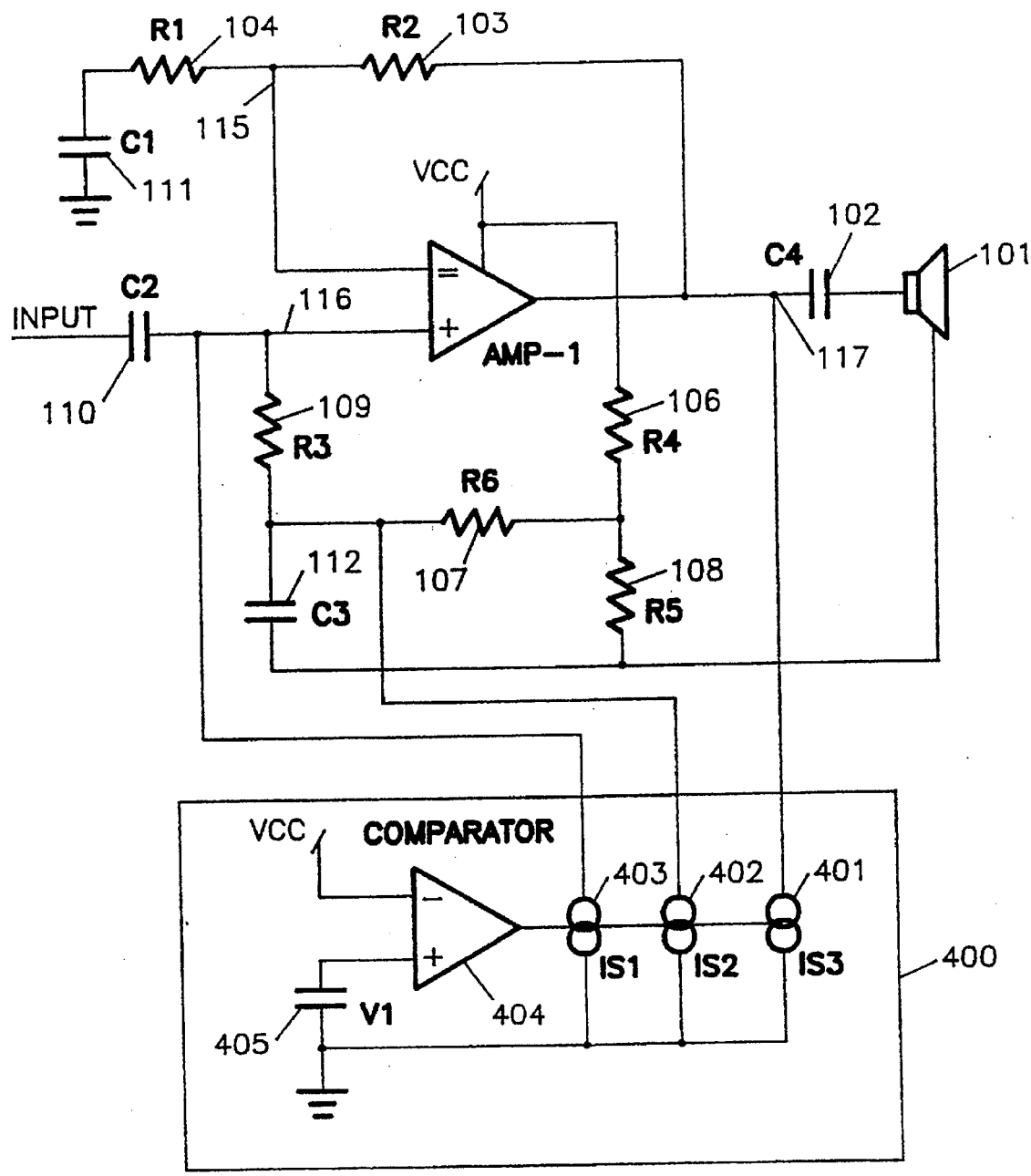
FIG. 4 shows discharge circuit 400 in an audio amplifier for discharging external capacitors in accordance with the present invention.

To prevent pop noise resulting from a momentary power off situation, the present invention provides a discharge circuits for discharging the external capacitors of an audio amplifier. The discharge circuit of the present invention is illustrated by FIG. 4. FIG. 4 shows discharge circuit 400 in an audio amplifier for discharging external capacitors in accordance with the present invention. Discharge circuit 400 can be incorporated, for example, into an audio amplifier integrated circuit, such as audio amplifier circuit 140 of FIG. 1. To facilitate comparisons between the figures, like elements in FIGS. 1 and 4, and also in all other figures, are provided like reference numerals. As shown in FIG. 4, current sources 401, 402 and 403 are provided to discharge the charge on capacitors 102, 112 and 110 respectively. Current sources 401, 402 and 403 are enabled when comparator 404 detects that the supply voltage $V_{cc}$ falls below a predetermined level of a reference voltage source 405. In this manner, when the supply voltage $V_{cc}$ is detected to fall below the predetermined voltage level of voltage source 405, capacitors 102, 112 and 110 are discharged, so that a subsequent power-on sequence will not result in pop noise from the residue charge on the external capacitors of the audio amplifier.

Figure 5A:
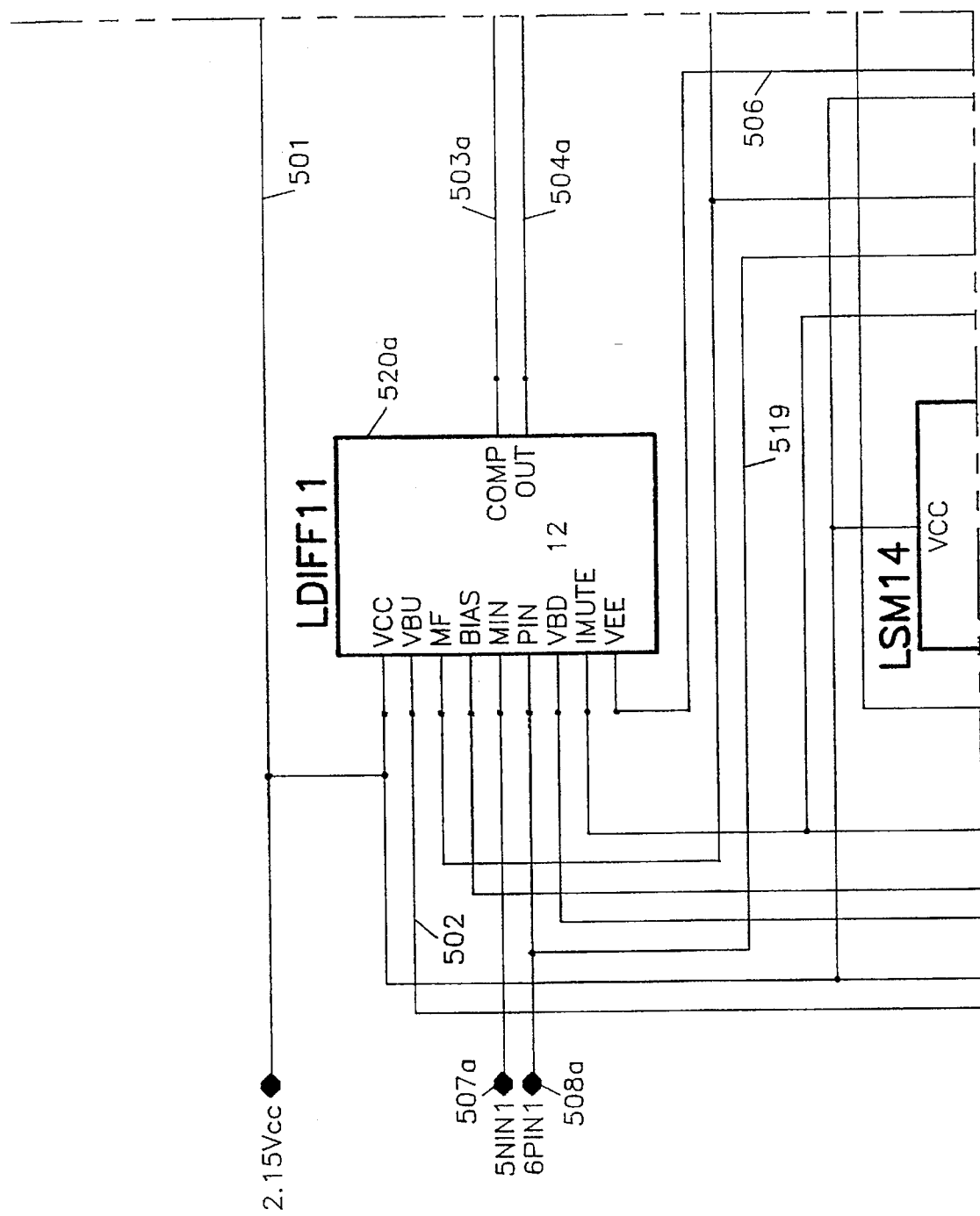
FIG. 5 is a block diagram of an embodiment of the present invention in audio amplifier integrated circuit 500.
Figure 5C:
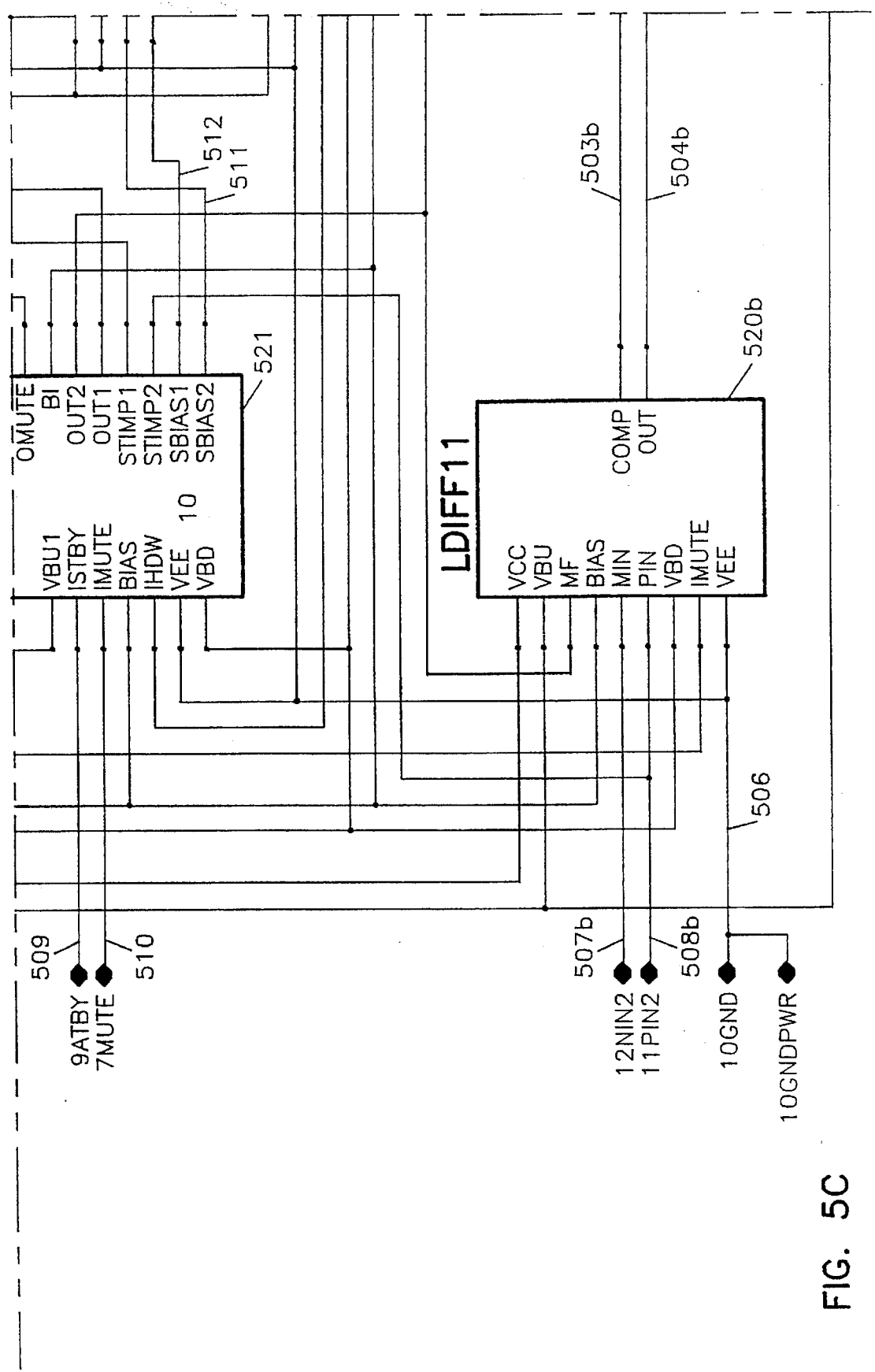
Figure 5D:
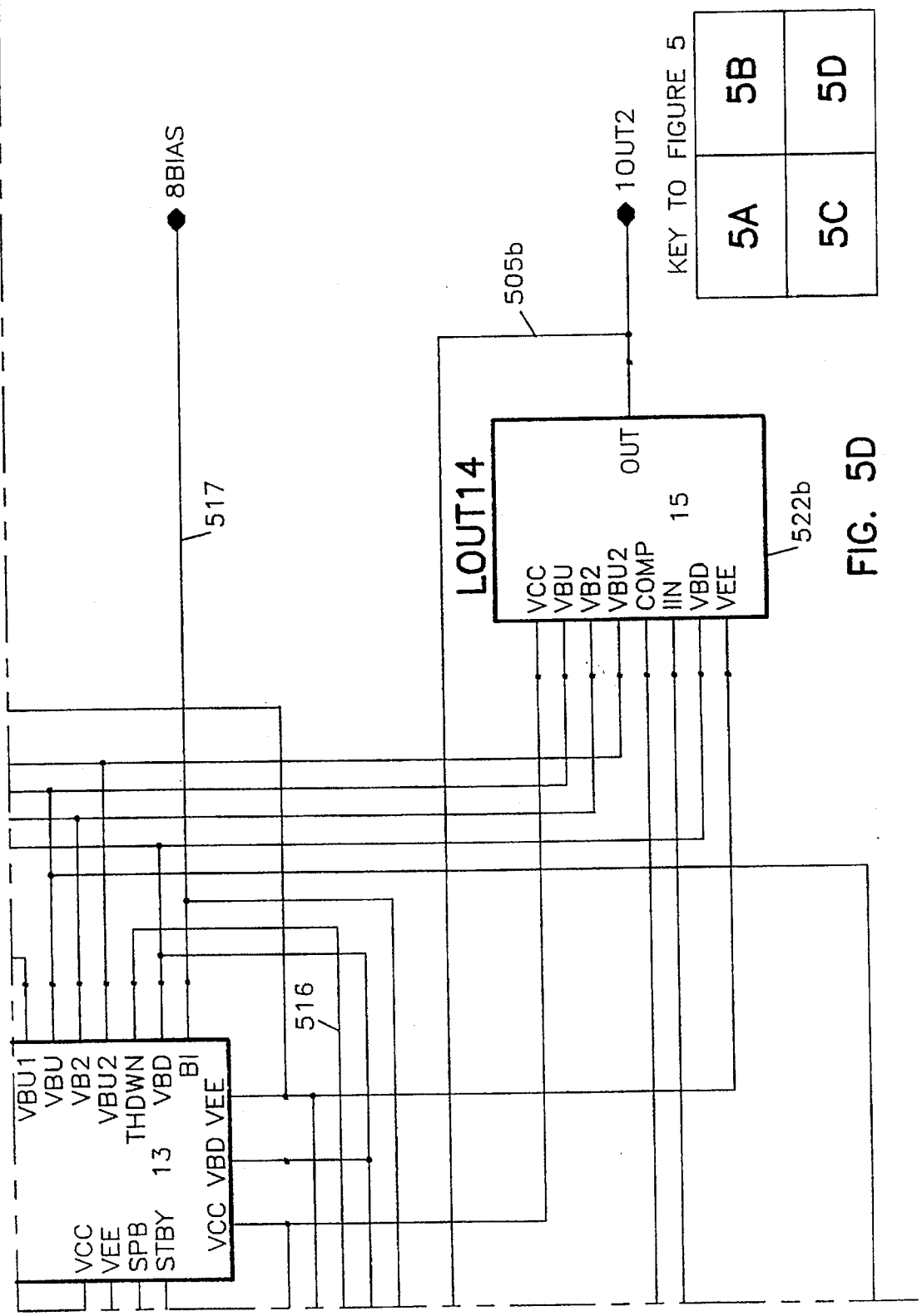
Figure 6A:
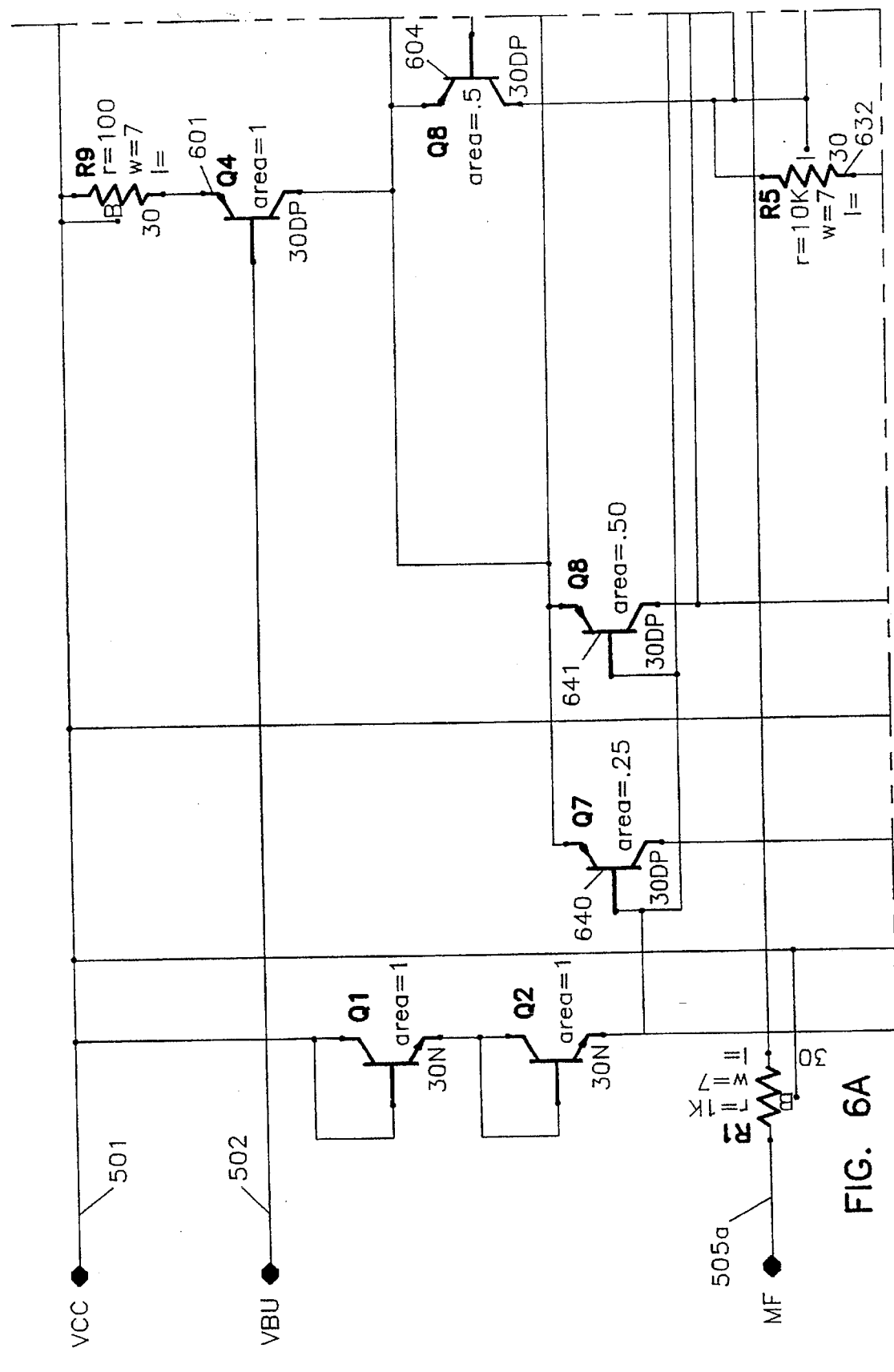
FIG. 6 is a schematic circuit showing input stage 520a in audio amplifier integrated circuit 500 of FIG. 5.
Figure 6B:
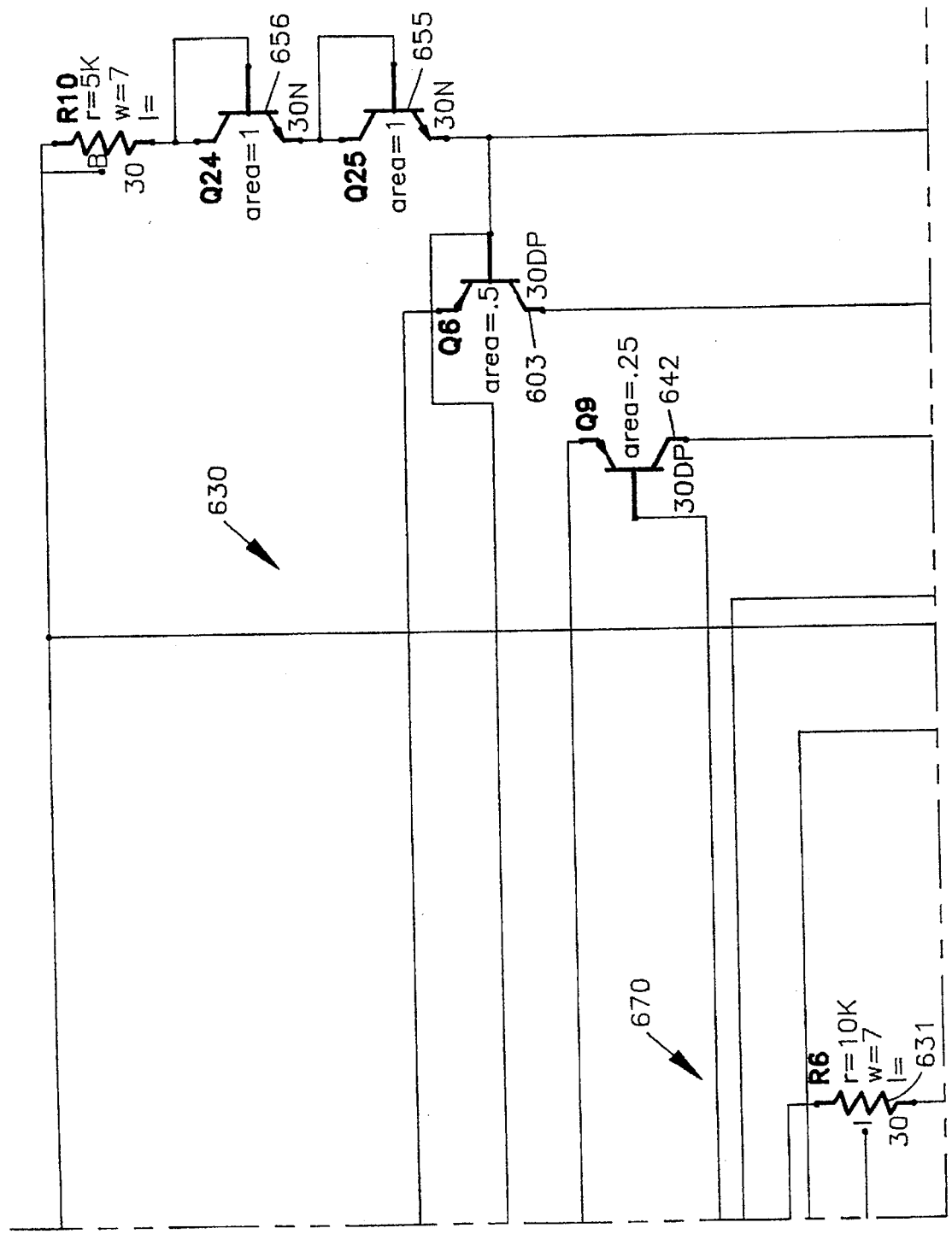
Figure 6C:
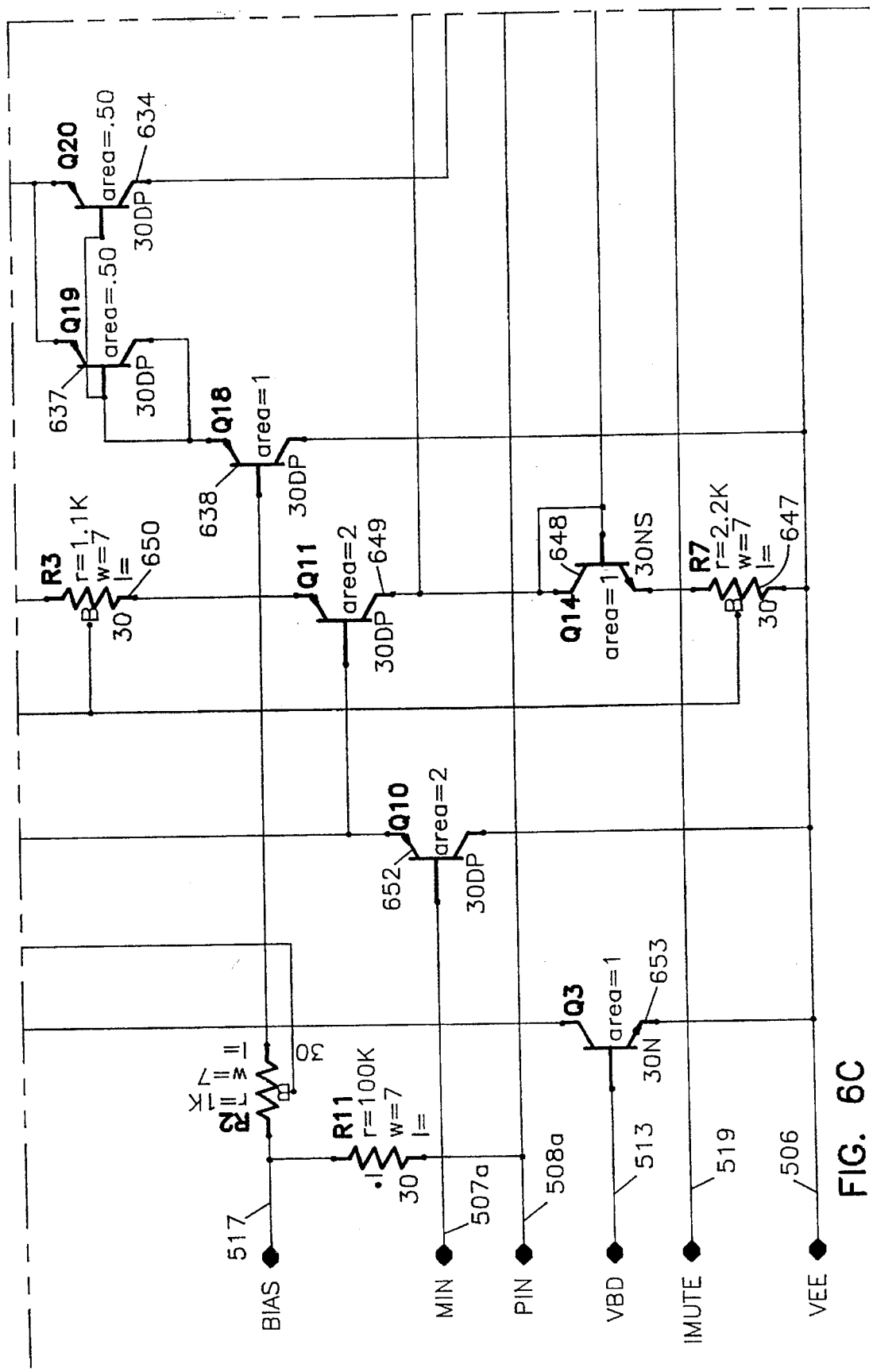
Figure 6D:
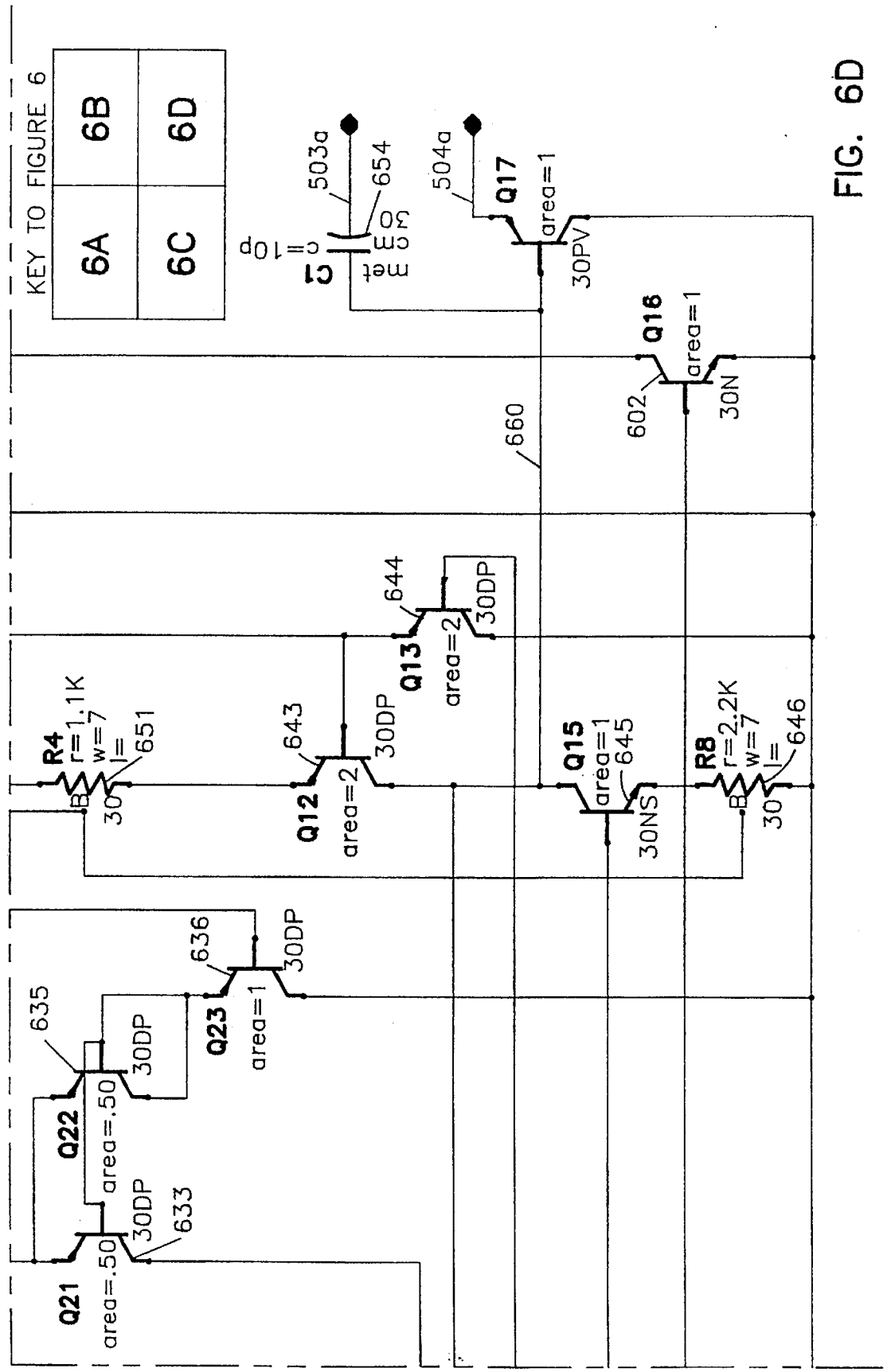
Figure 7A:
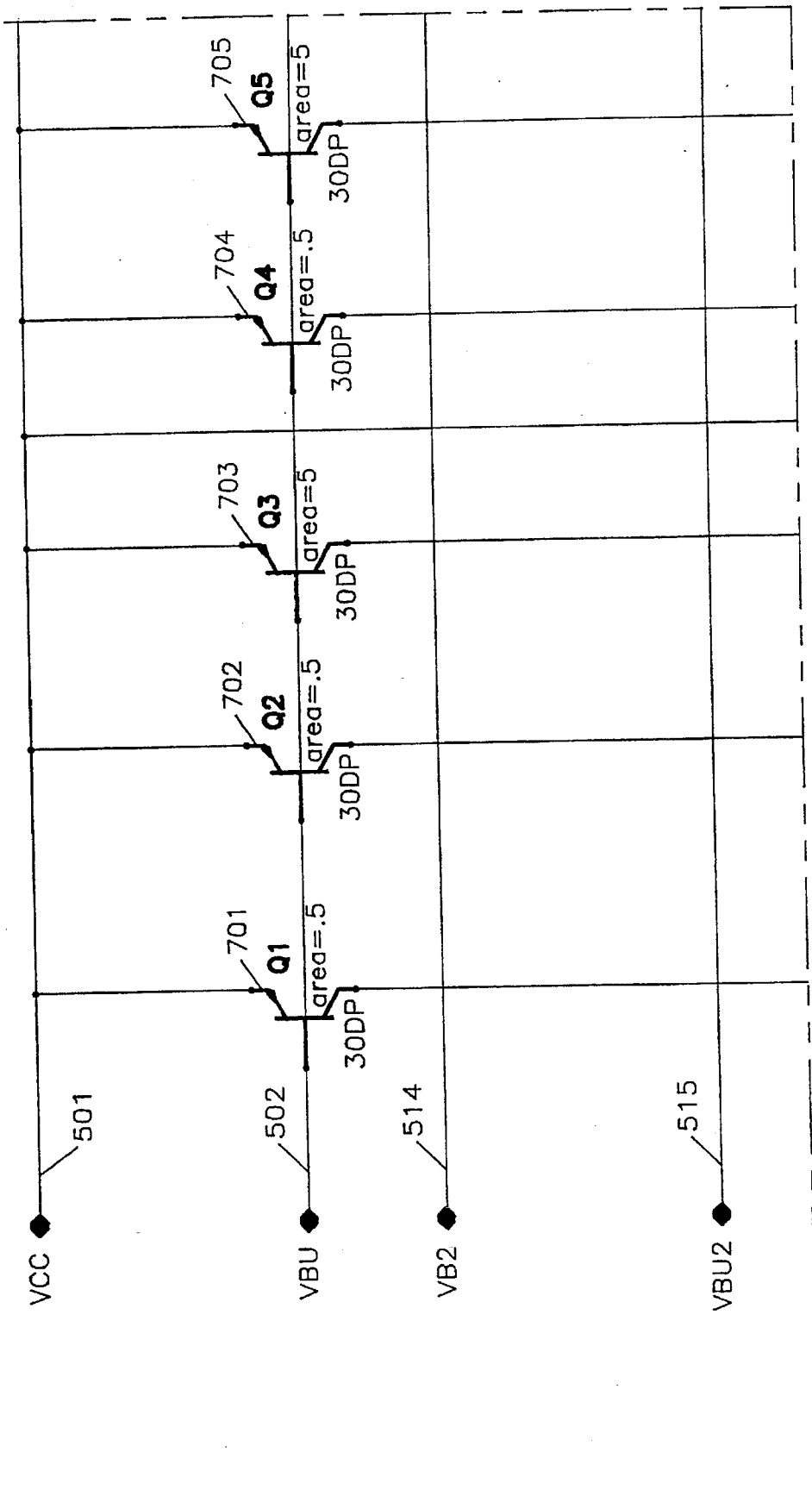
FIG. 7 is a schematic circuit showing output stage 522a in audio amplifier integrated circuit 500 of FIG. 5.
Figure 7B:
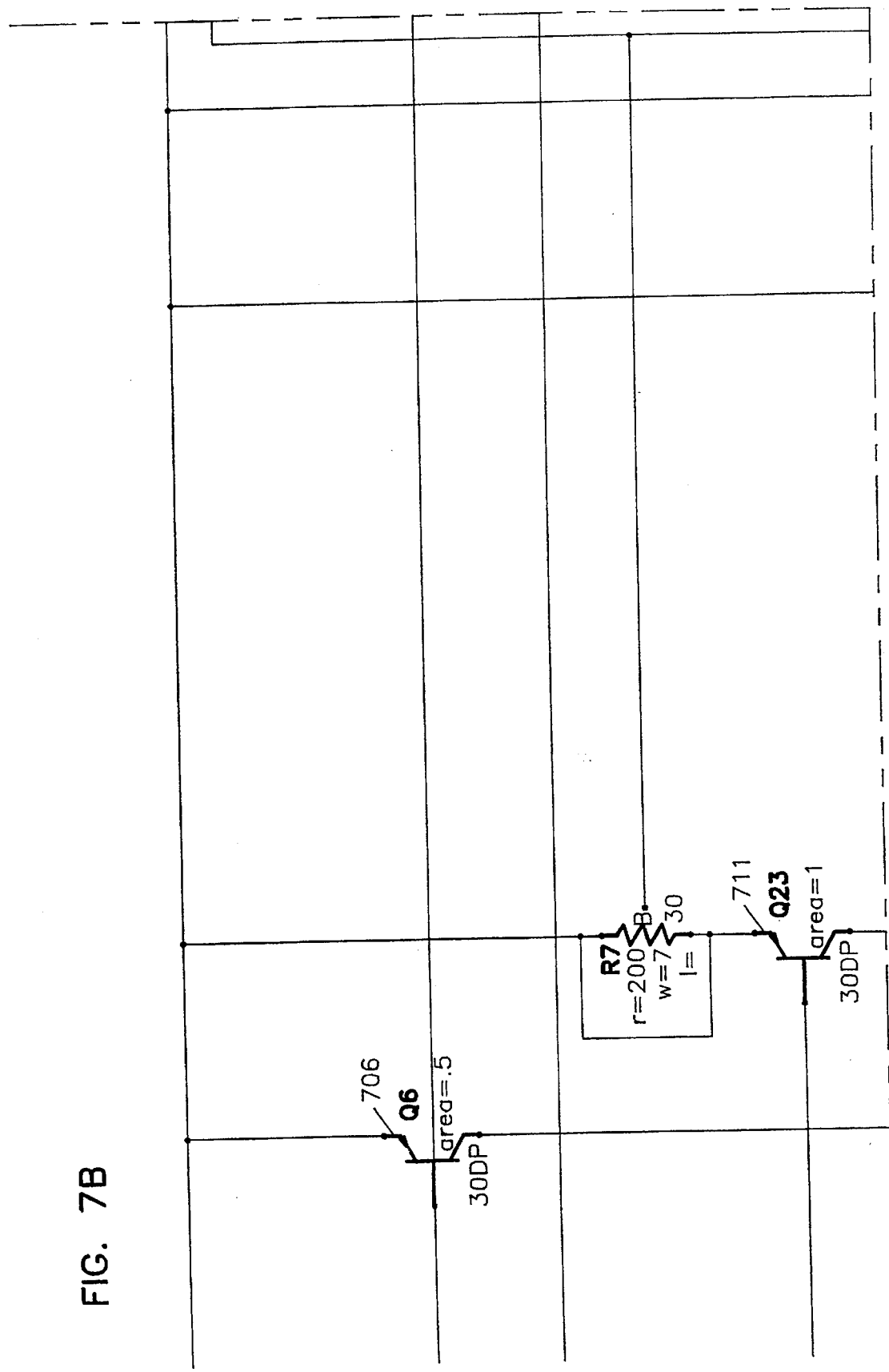
Figure 7C:
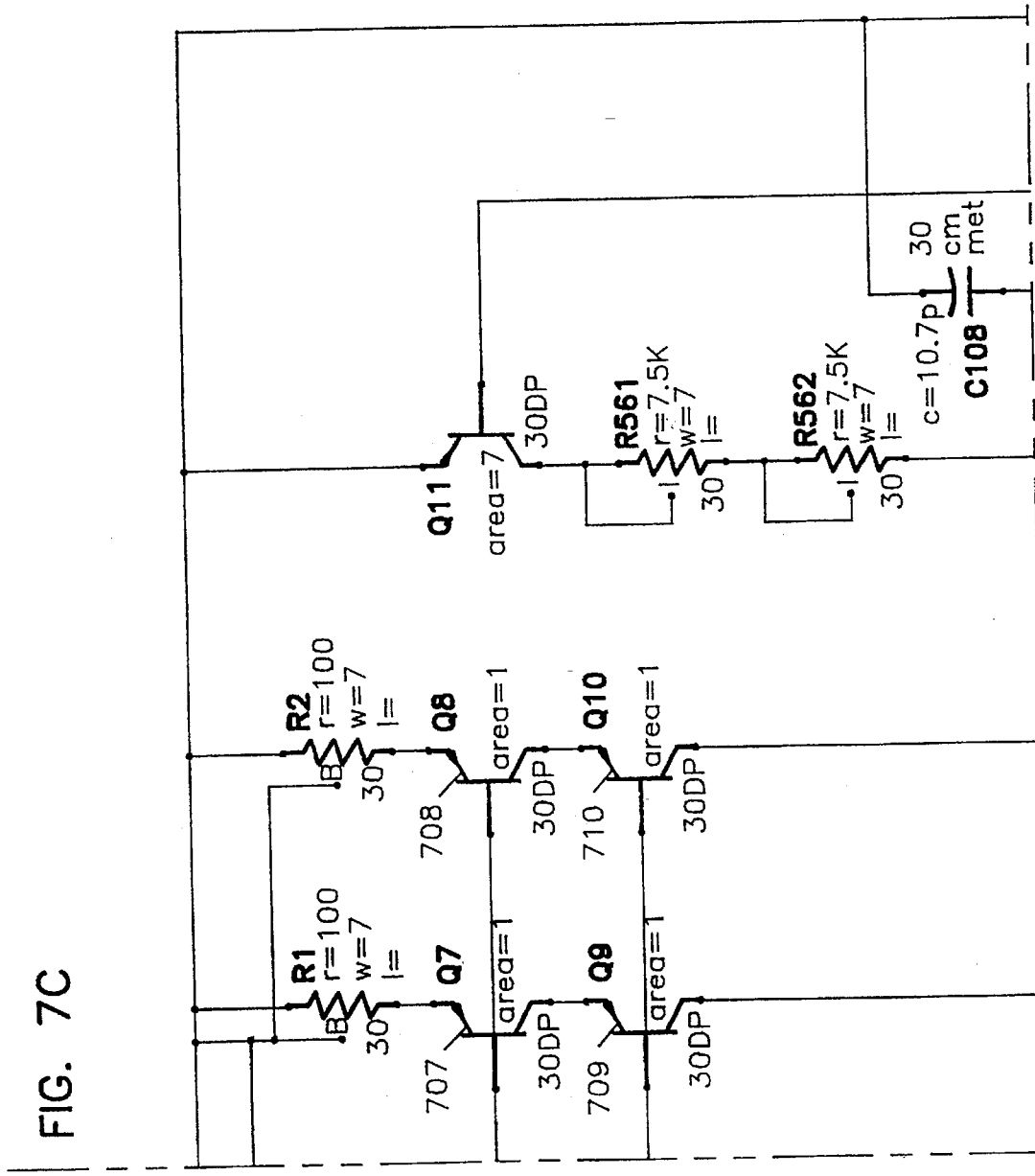
Figure 7D:
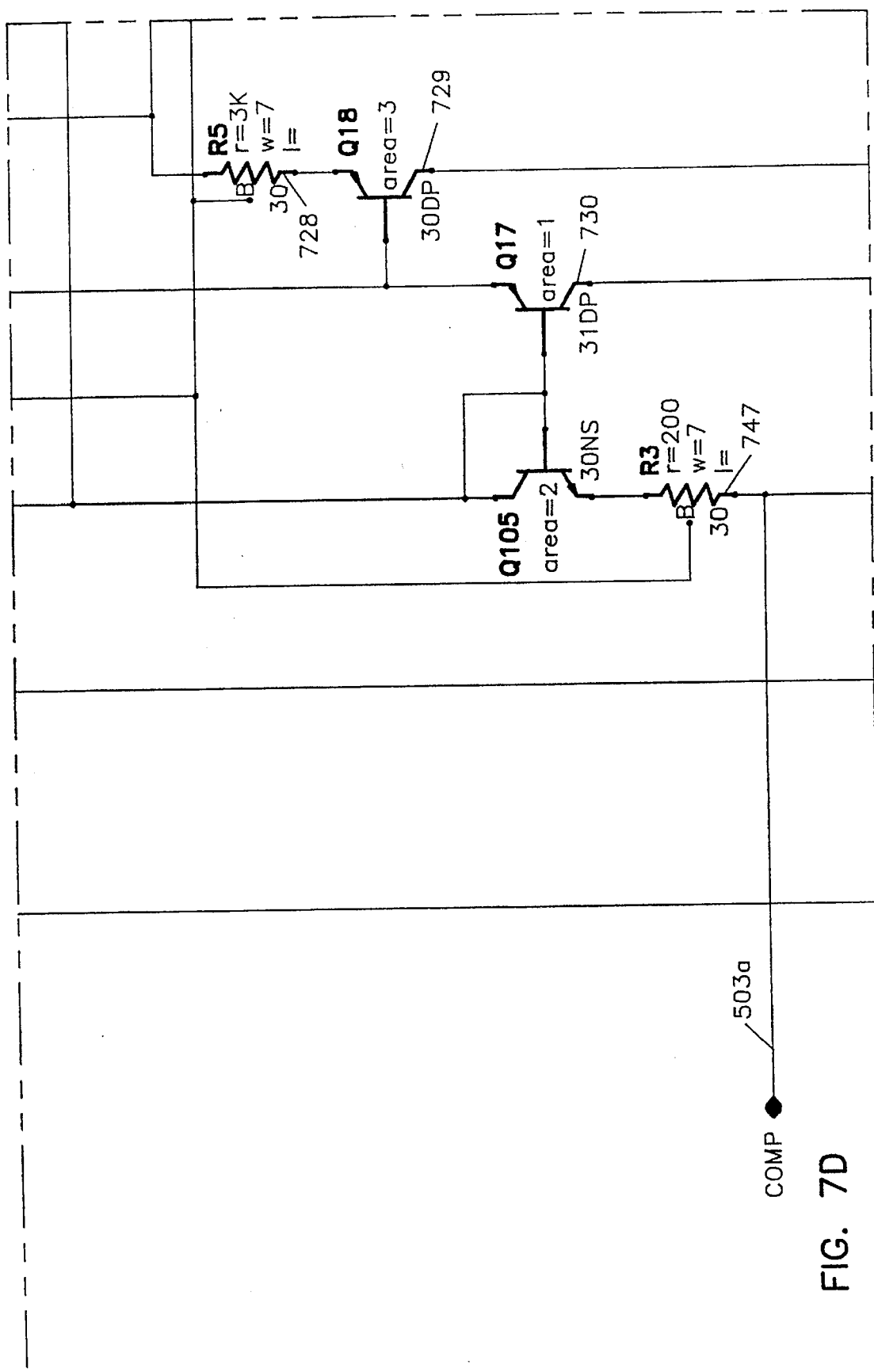
Figure 7E:
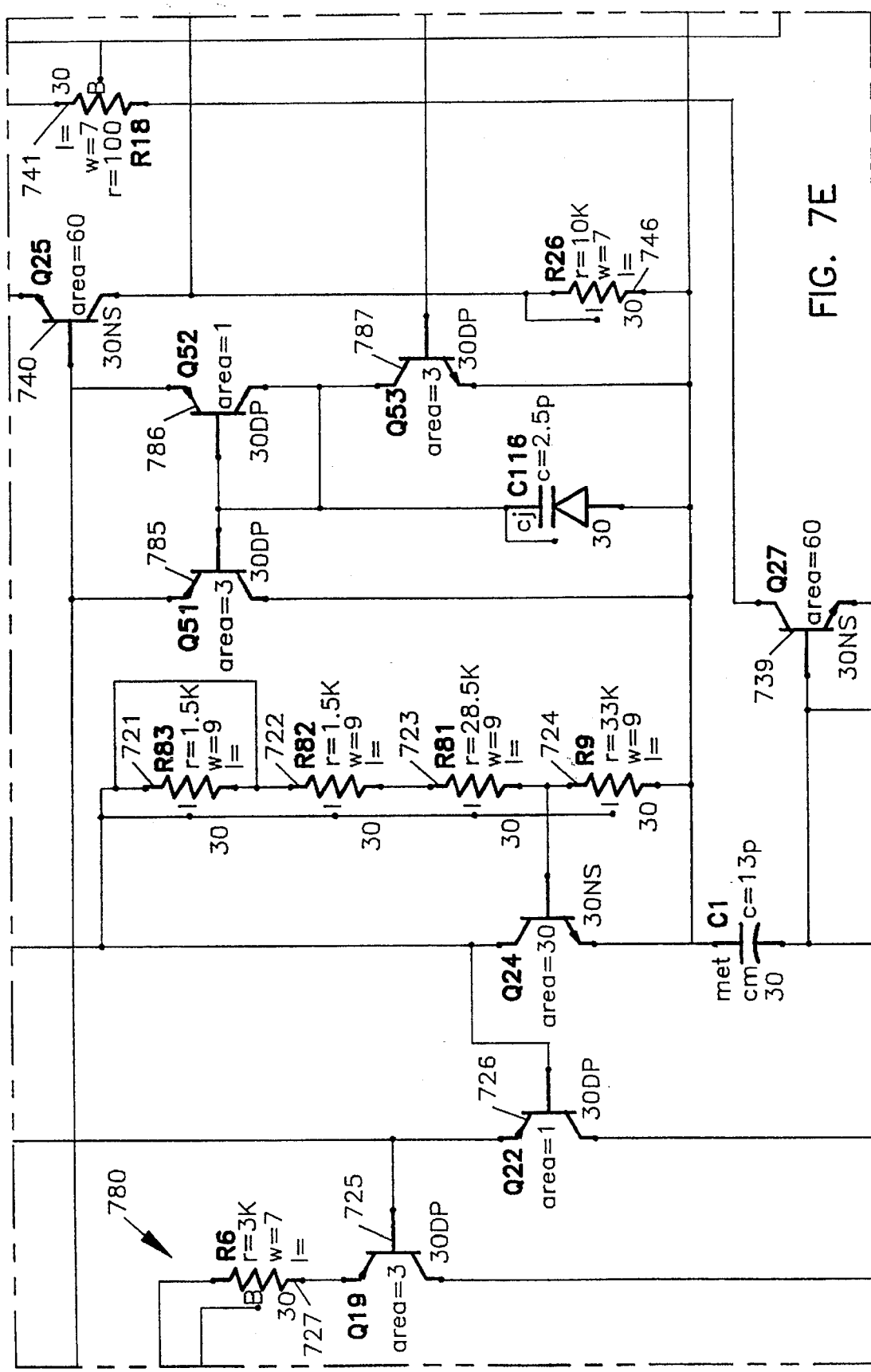
Figure 7F:
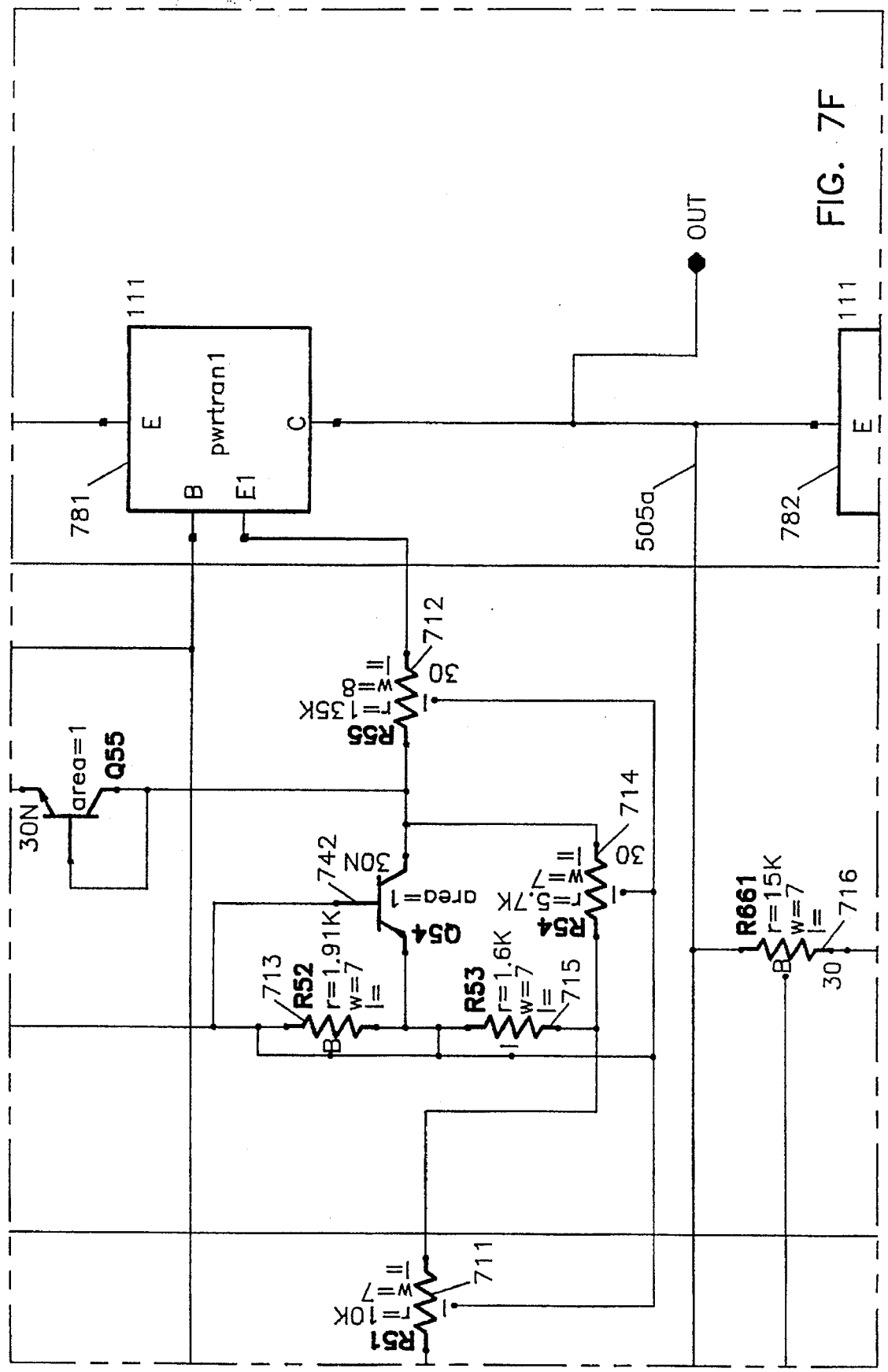
Figure 7G:
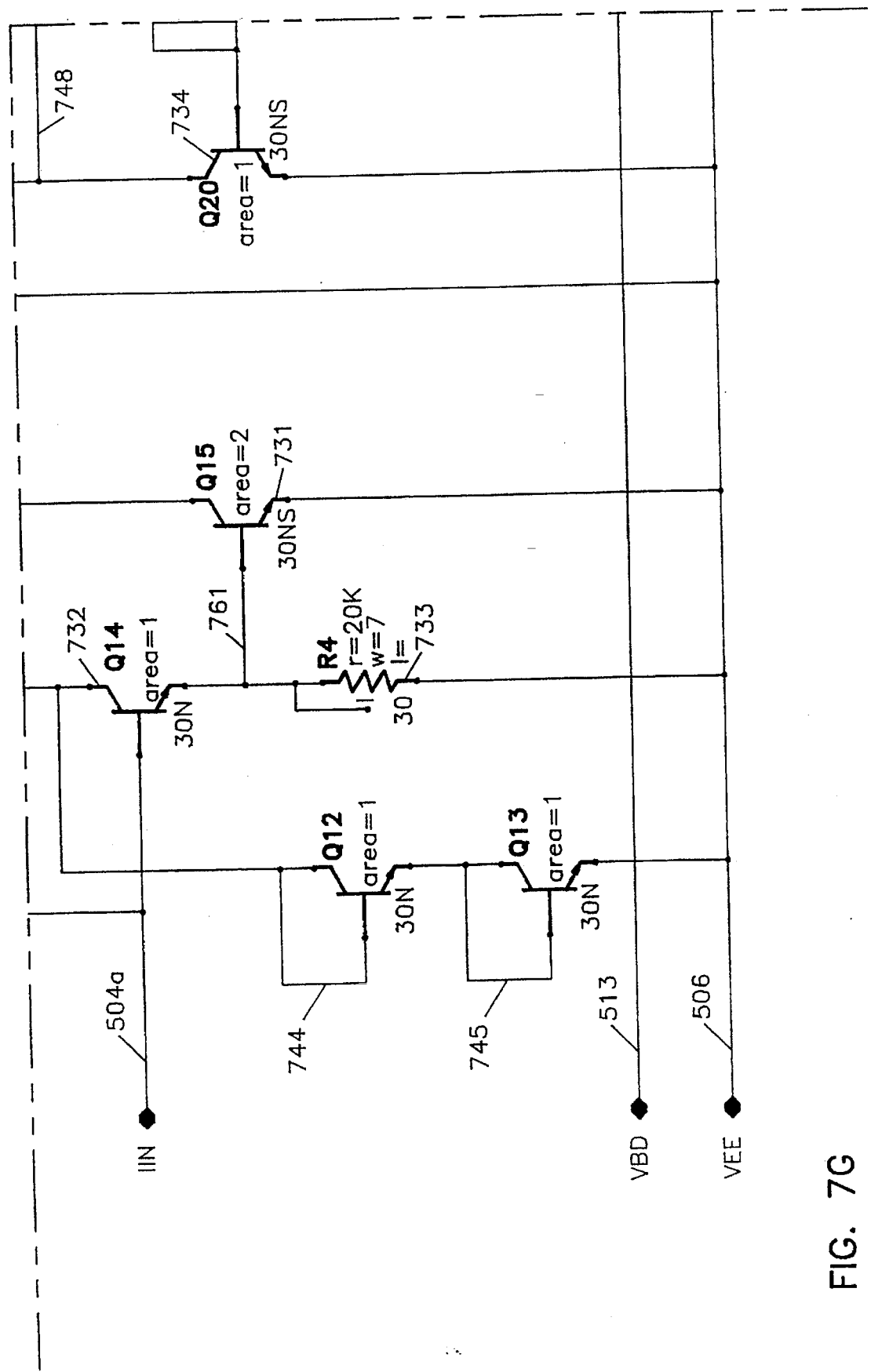
Figure 7H:
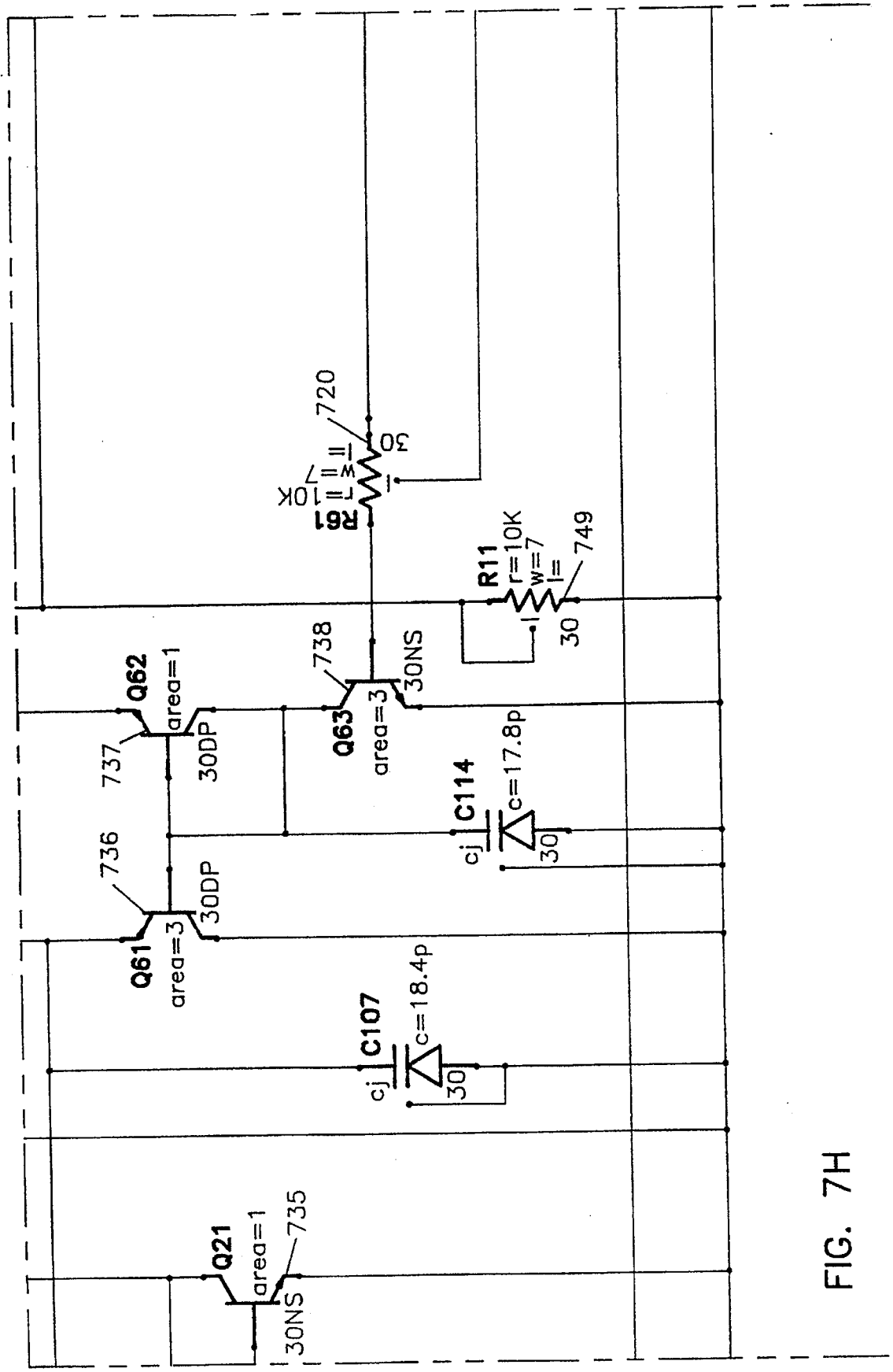
Figure 7I:
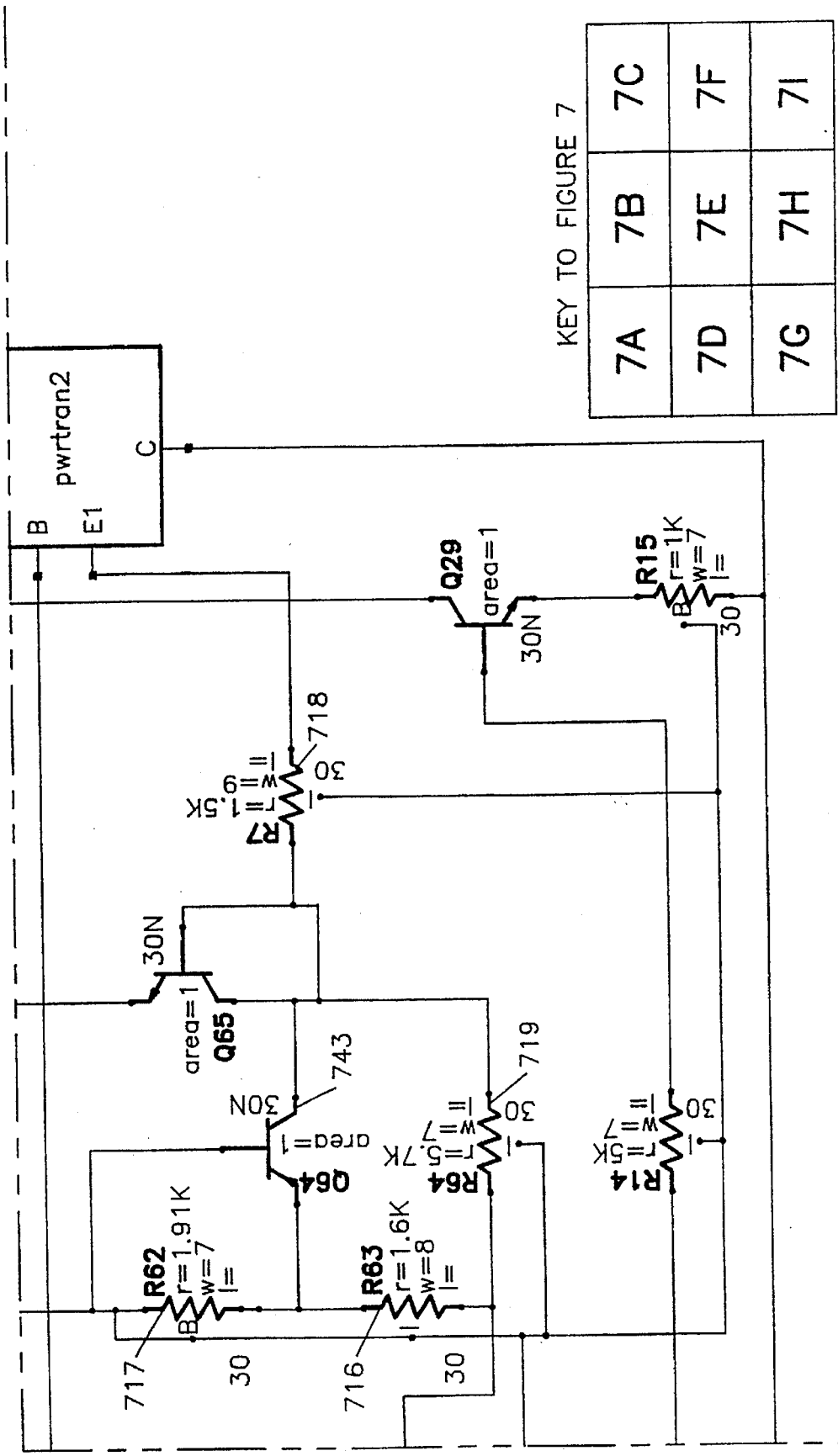
Figure 8A:
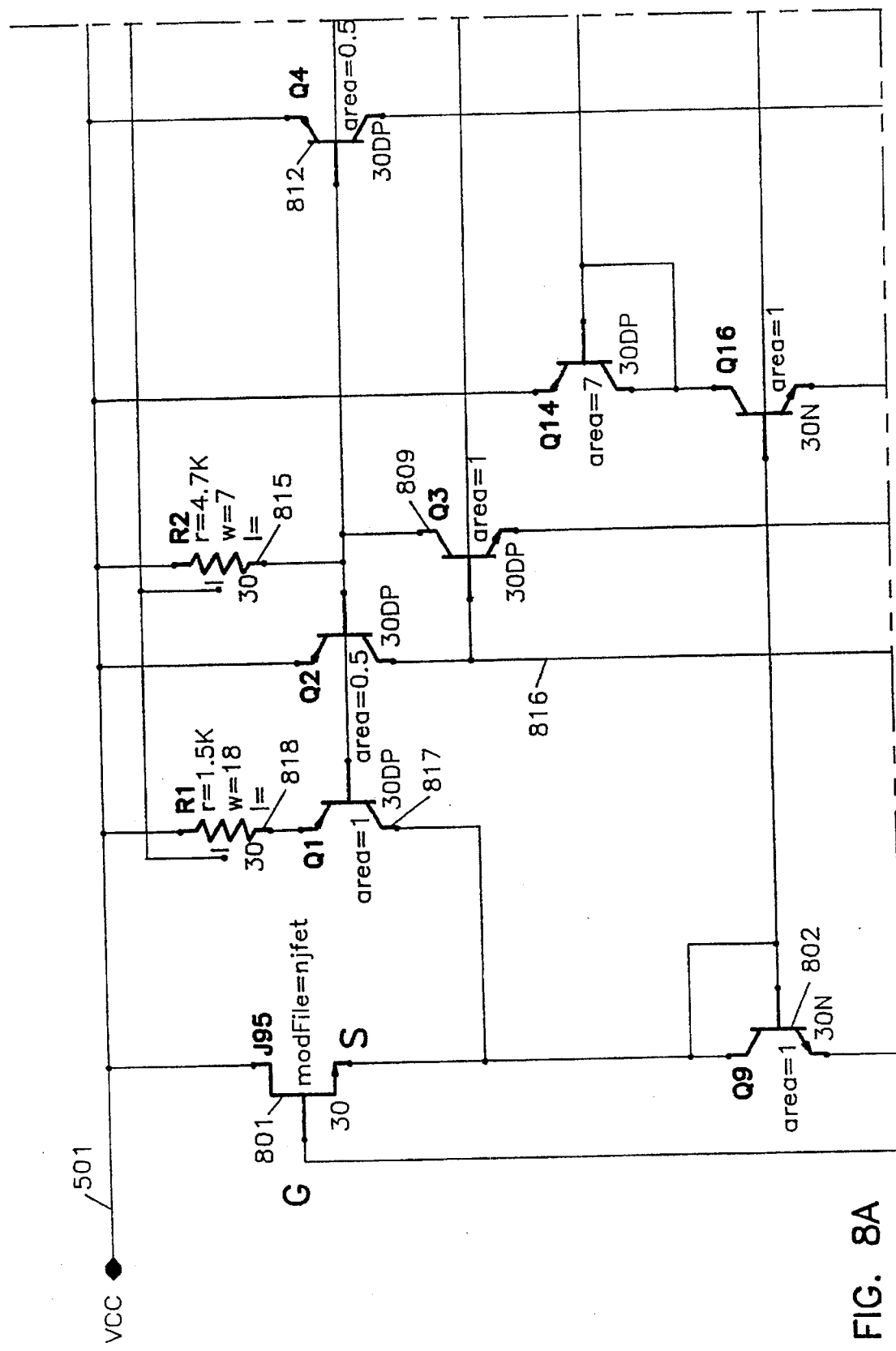
FIG. 8 is a schematic circuit showing bias generation circuit 523 in audio amplifier integrated circuit 500 of FIG. 5.
Figure 8B:
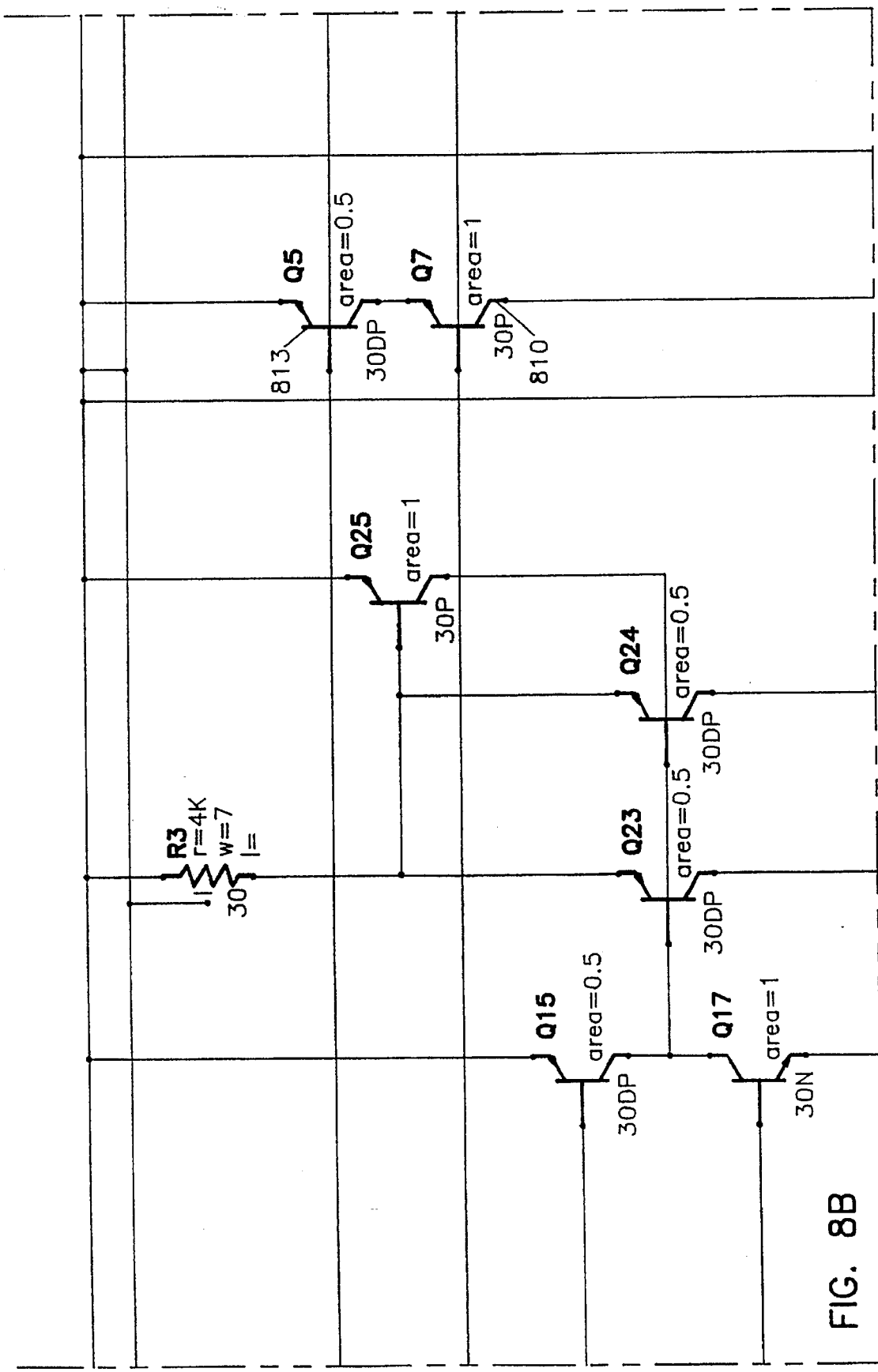
Figure 8C:
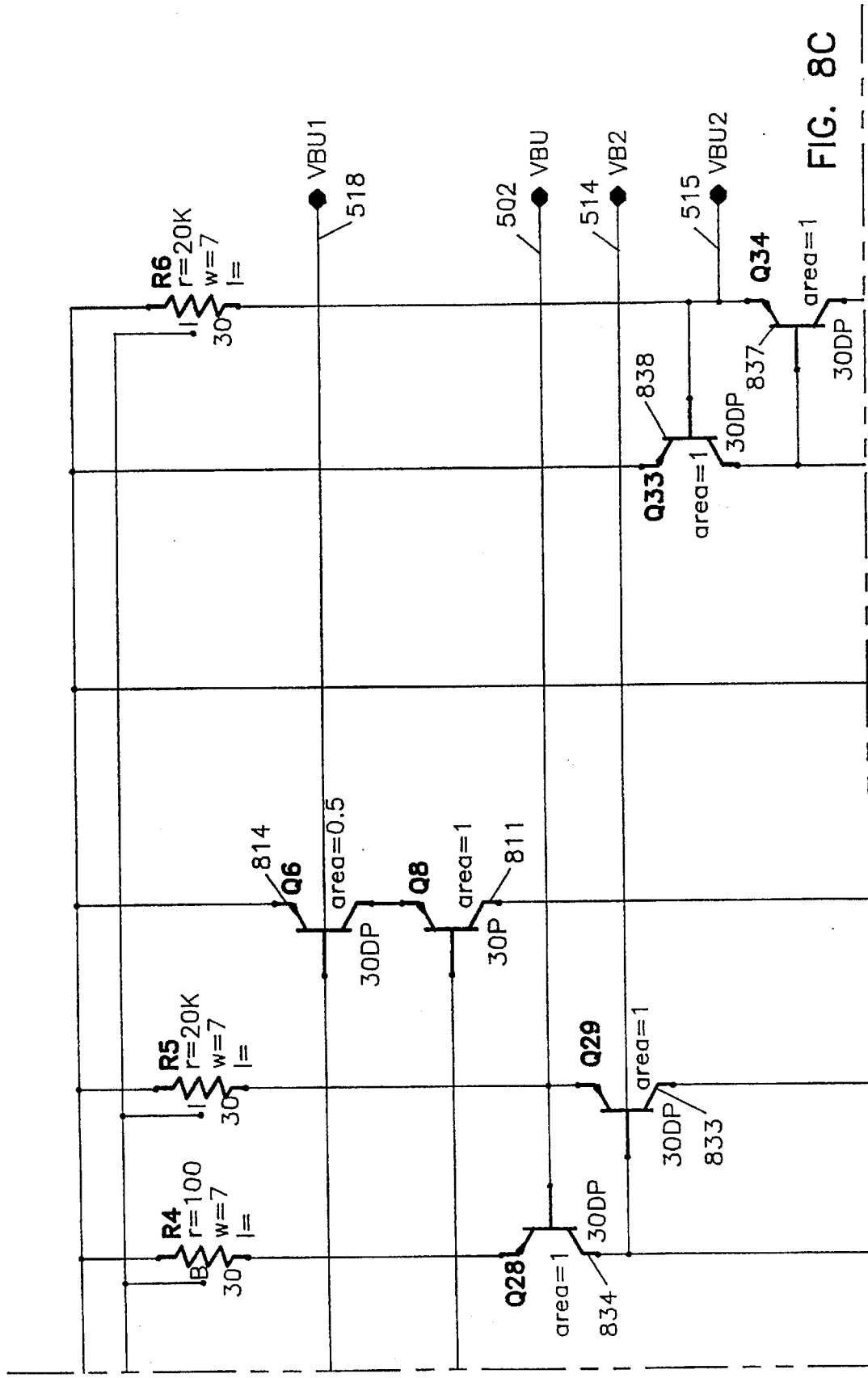
Figure 8D:
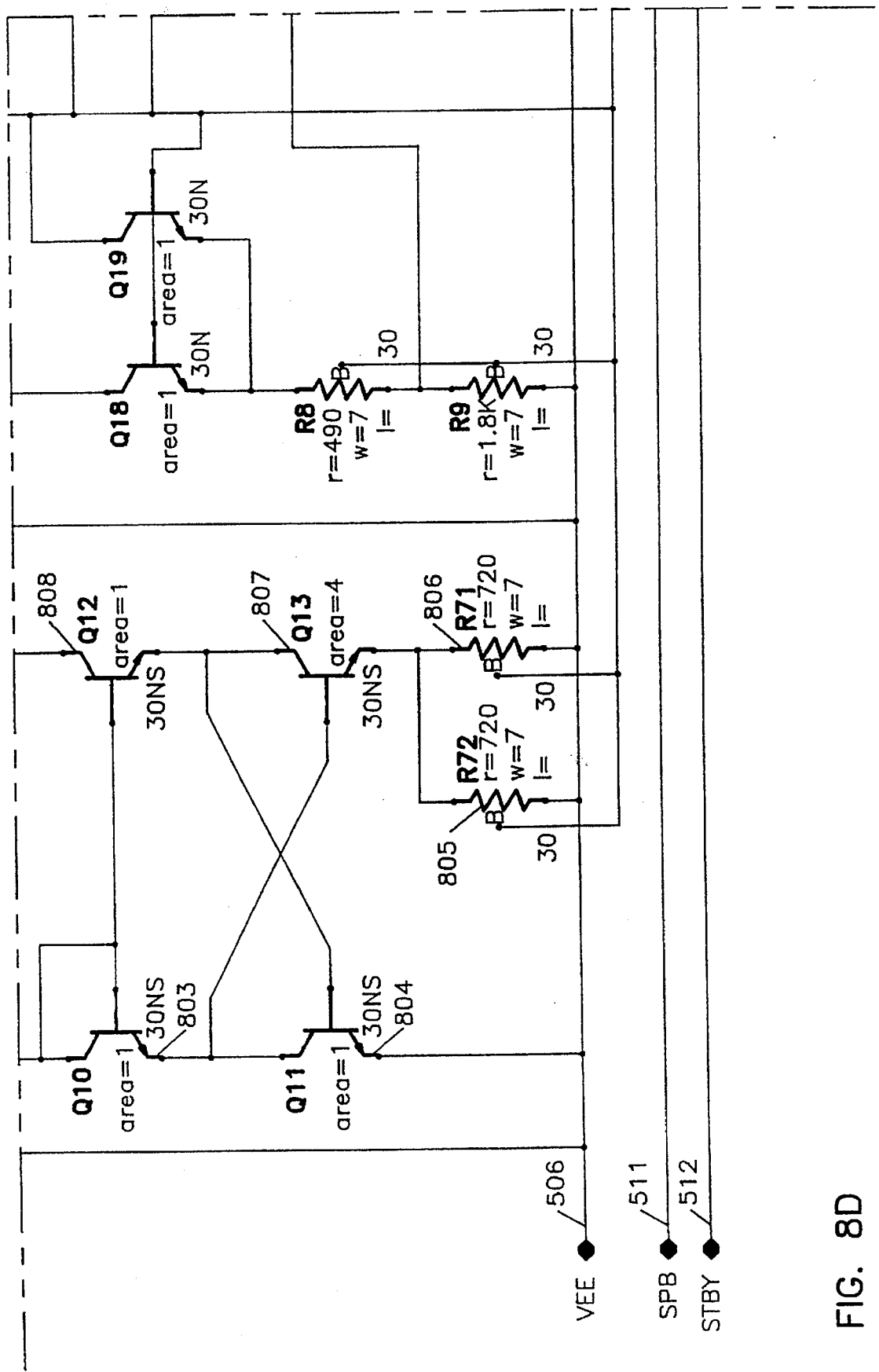
Figure 8E:
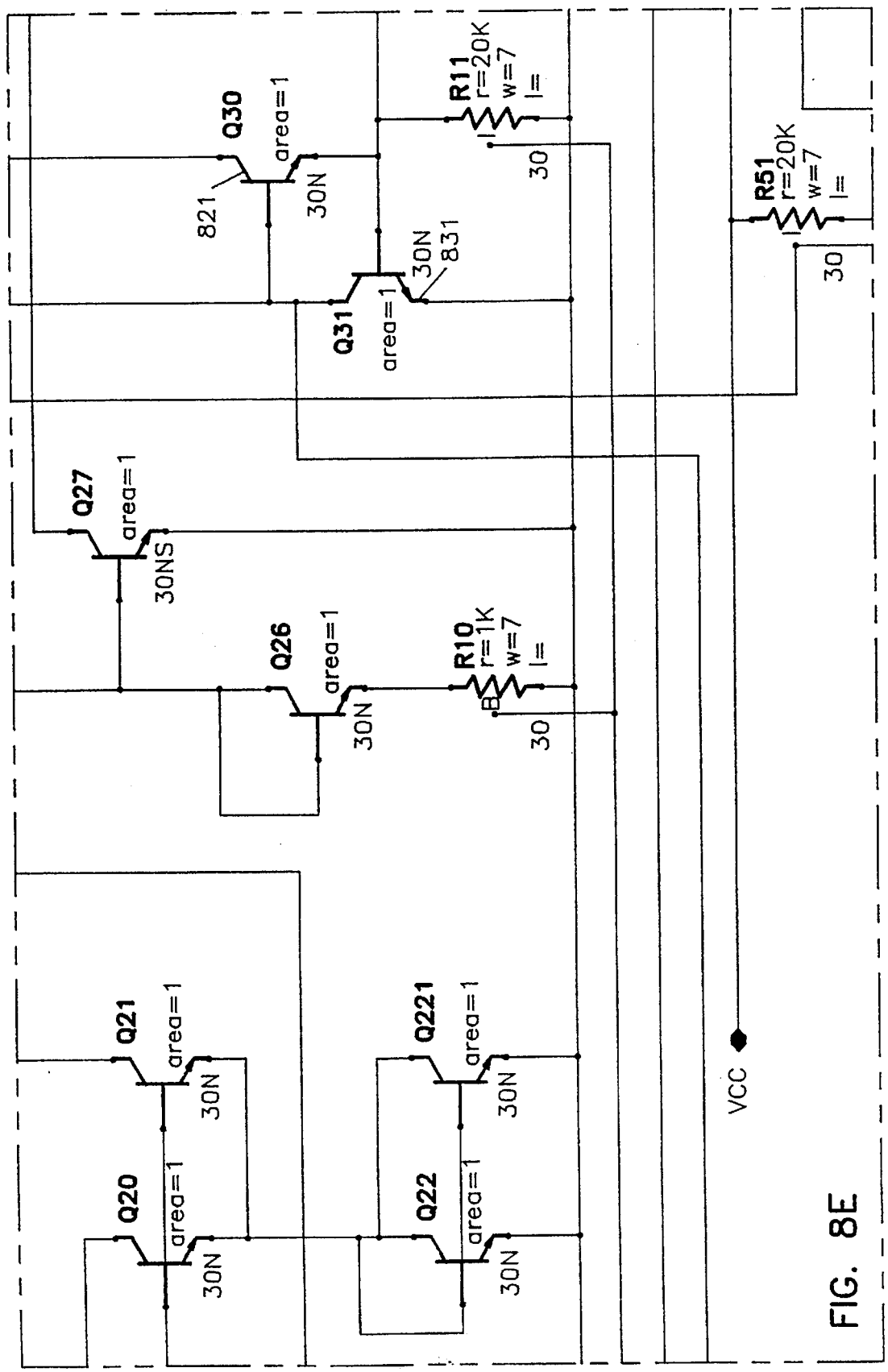
Figure 8F:
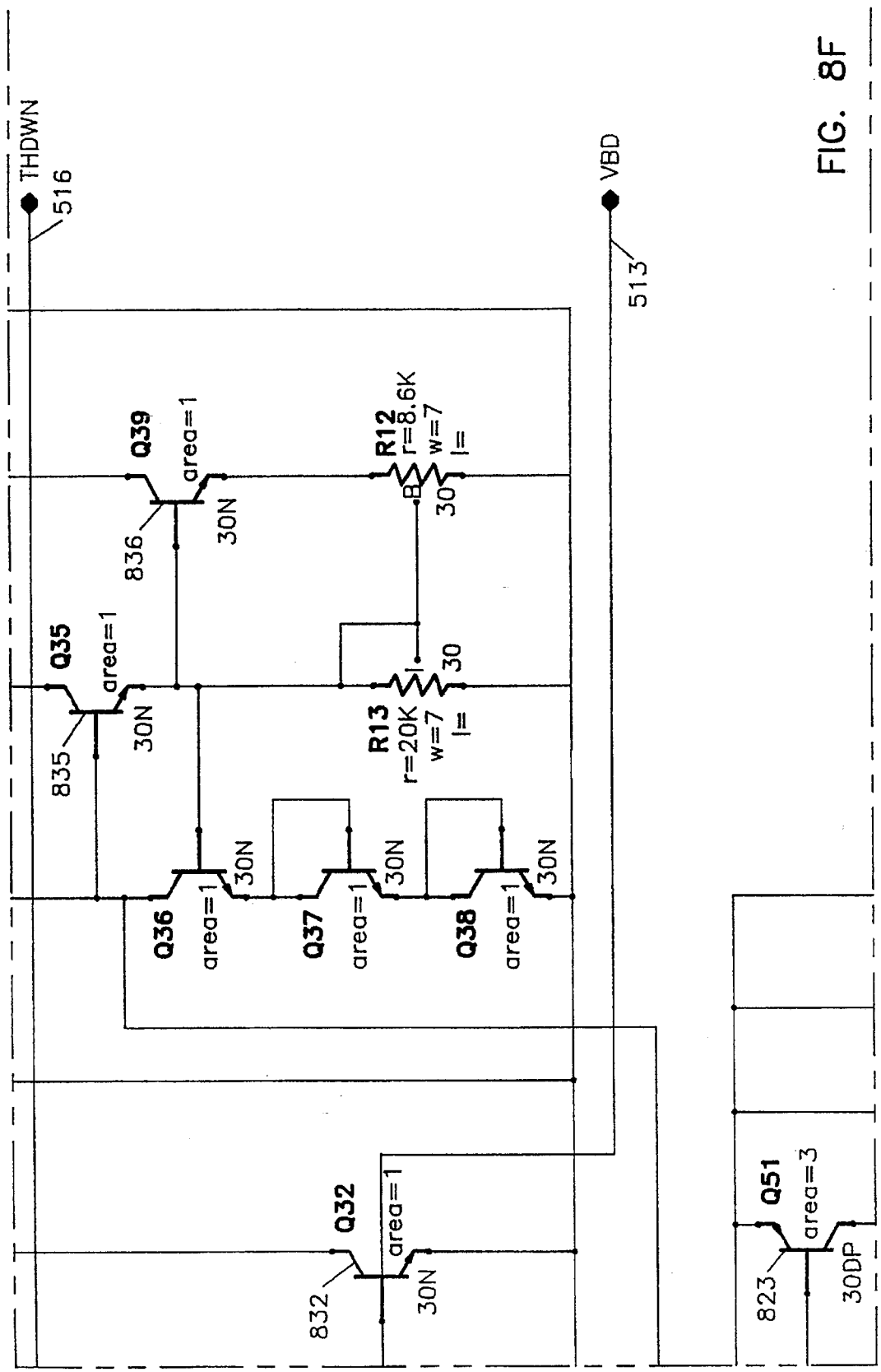
Figure 8G:
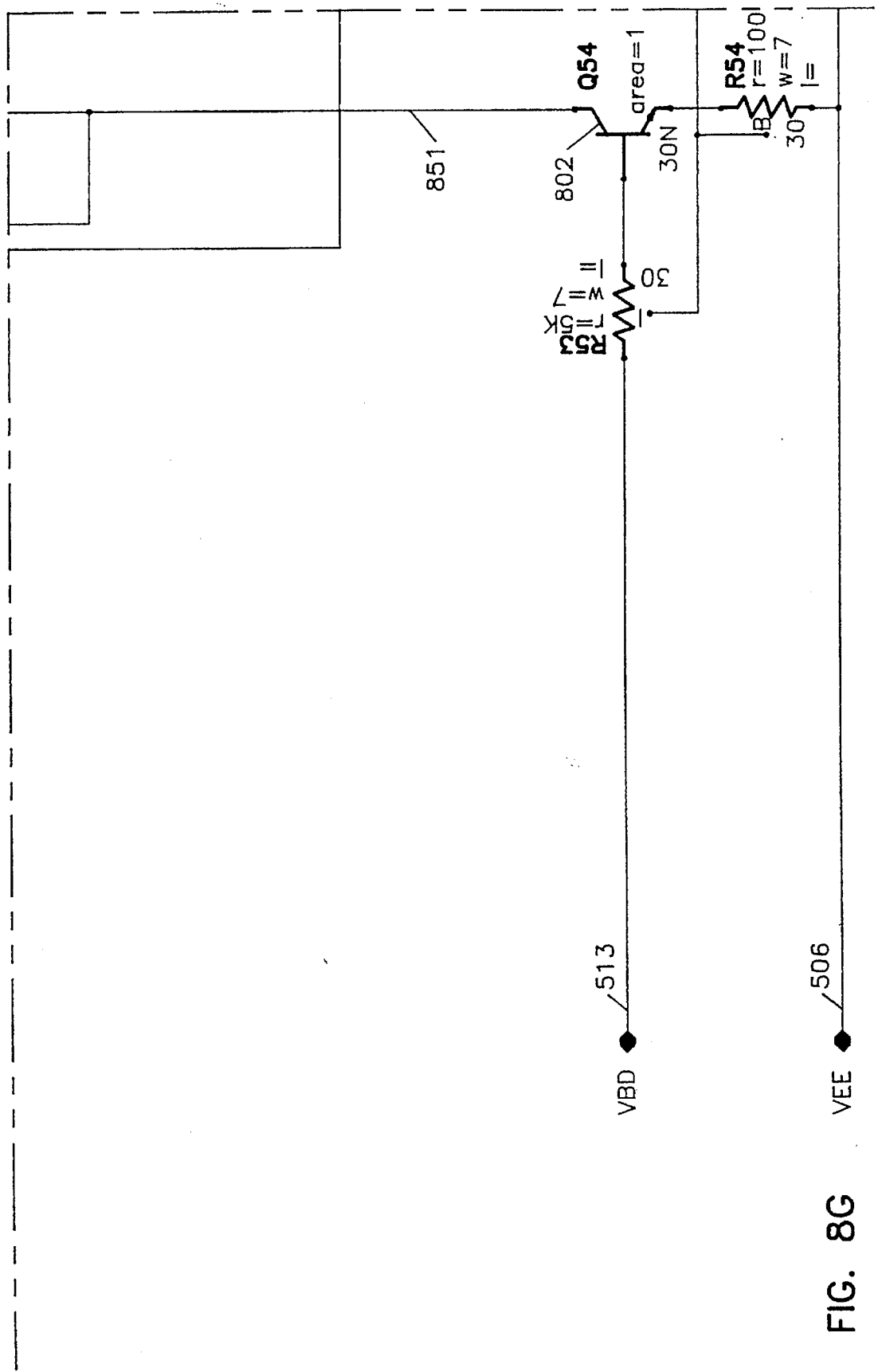
Figure 8H:
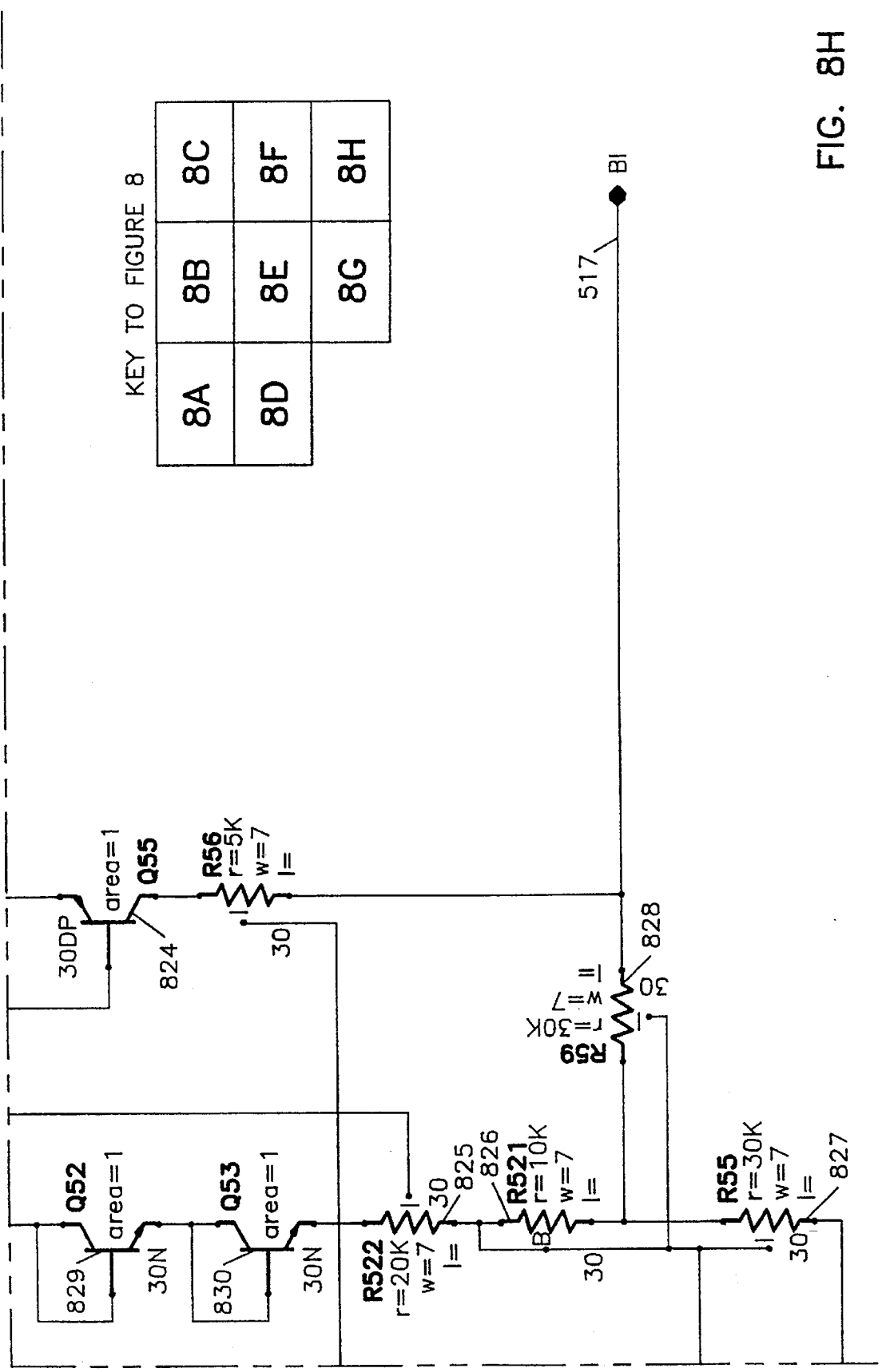

The present invention can be implemented in an audio amplifier integrated circuit. One embodiment of such an integrated circuit is audio amplifier integrated circuit 500 of FIG. 5. FIG. 5 is a block diagram of audio amplifier integrated circuit 500, which is a dual-channel audio amplifier. As shown in FIG. 5, audio amplifier 500 includes input stages 520a and 520b, output stages 522a and 522b, bias generation circuit 523, and control circuit 521. Circuit 500 receives two differential input signals provided across terminals 507a and 508a and 507b and 508b respectively, and provides two output audio signals at terminals 505a and 505b, and a bias voltage at terminal 517. In addition to power and ground supply voltages, provided respectively at terminals 501 and 506, circuit 500 receives control signals "ATBY" and "MUTE", which perform the functions "stand by" and "mute", respectively, familiar to those skilled in the art. Control circuit 521 includes the circuit for discharging the external capacitors of the present invention.

The structure and operation of audio amplifier integrated circuit 500 are discussed next with reference to FIGS. 6, 7, 8, 9a and 9b. FIGS. 6, 7, 8, 9a and 9b are respectively the schematic diagrams of input stage 520a, output stage 522a, bias generation circuit 523, and first and second portions of control circuit 521. In this embodiment, input stage 520a and 520b are identical, and output stages 522a and 522b are identical.

Initially, when power is first turned on, JFET 801 (FIG. 8) provides an initial current to NPN transistors 802, 803 and 804, which turn on NPN transistors 807 and 808. NPN transistors 803 and 808 are sized identically, so that terminal 816 has a voltage determined by the current in NPN transistor 808, $V_{BE}$ of NPN transistor 807 and resistors 806. Bias voltages are created at terminal 518 ("VBU1") and terminal 816 by PNP transistors 809 and 817 and resistors 815 and 818. Bias voltages at terminals 518 and 816 are used to enable current sources, which are typically implemented by PNP transistors coupled to $V_{CC}$, e.g. PNP transistors 813, 814, 810, and 811.

In this embodiment, voltage source 405 shown in FIG. 4 is implemented by a special type of transistor having two peripheral collectors. Two such transistors, represented in FIG. 9a by transistor pairs 901a–901b and 902a–902b, respectively, are used in this embodiment. (In FIG. 9a, although drawn as two transistors 901a and 901b, transistors 901a and 901b are actually implemented by transistor 901 with two peripheral collectors. Likewise, transistors 902a and 902b are implemented by transistor 902 with two peripheral collectors). In this embodiment, voltage source 405 is implemented by, as shown in FIG. 9a, diode 905, resistors 904 and 906, and transistor 901.

Figure 10:
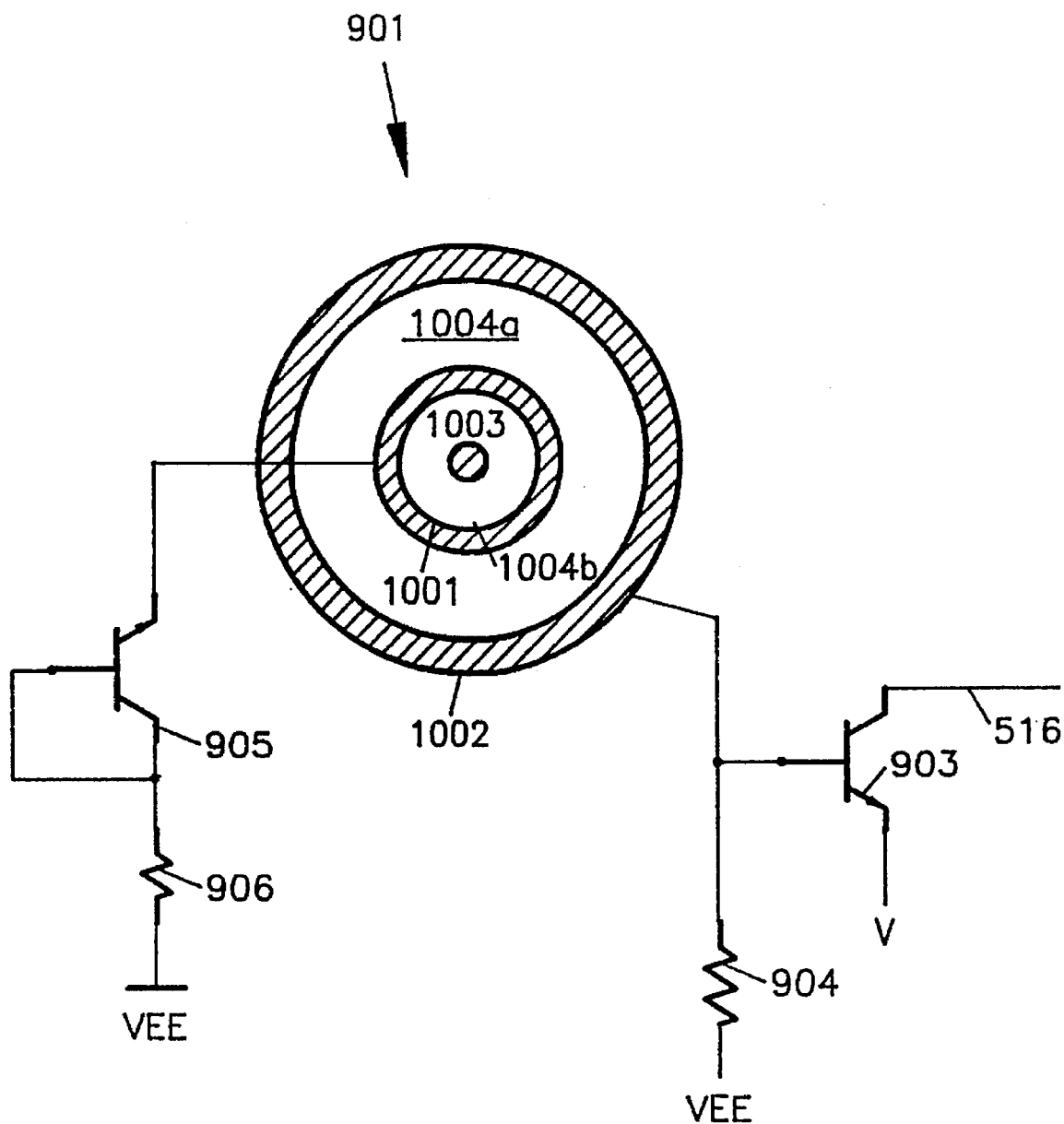

The structure and operation of voltage source 405, as implemented by transistor 901 are illustrated by FIG. 10. In FIG. 10, transistor 901 is represented by a cross section of transistor 901's layout, showing peripheral collectors 1001 and 1002. As shown in FIG. 10, transistor 901 has a P-type emitter (region 1003) coupled to supply voltage $V_{CC}$, base regions 1004a and 1004b, and peripheral collector regions 1001 and 1002. Peripheral collector region 1002 is coupled to diode 905. Peripheral collector region 1002 is coupled to resistor 904. During the power-up phase, as supply voltage $V_{cc}$ rises, diode 905 is reversed biased until $V_{cc}$ reaches diode 905's breakdown voltage of approximately 6.8 volts. Before $V_{cc}$ reaches 6.8 volts, current flows through resistor 904 via collector region 1002, which is a higher resistance current path than the current path through collector region 1001. Consequently, the voltage at the base terminal of NPN transistor 903 rises, thereby maintaining the signal "IHDW" at terminal 516 (coupled to the collector of NPN transistor 903) at ground level. During this time, NPN transistor 909, whose base terminal is coupled to terminal 516 is in a non-conducting state, so that terminals 951, 952 and 953, which are coupled to NPN transistor 909's collector, remain close to supply voltage $V_{CC}$. Consequently, NPN transistors 911 and 912 (FIG. 9b), which are controlled respectively by the voltages on terminals 952 and 953, are conducting, thereby maintaining the voltages of control signals "SBIAS1/STBY" and "SBIAS2/SPB" (at terminals 512 and 511) respectively, at ground. At this time, NPN transistor 910, which is controlled by the voltage at terminal 951, is conducting. Thus, PNP transistor 914 switches on, which in turn switches on PNP transistors 907, 915, 916, 917, 918 and 919, which are provided as current sources. As PNP transistor 915 switches on, the voltage at terminal 956 rises towards supply voltage $V_{CC}$, thereby switching on PNP transistors 920 and 921 to provide a current discharge path for input terminals 508a and 508b ("STIMP1" and "STIMP2" respectively) to ground. Resistors 992 and 993 limit the base currents of NPN transistor 921 and 920, respectively, when input terminals 508a and 508b are substantially discharged.

As PNP transistor 918 switches on, NPN transistors 922 is also switched on, providing base currents to NPN transistors 925 and 926. NPN transistor 925 thus provides a current path for discharging and maintaining output terminal 505b at ground. Diodes 923 and 924 limits the current through resistor 927, since output terminal 505b is at ground voltage when fully discharged. Terminal 505a is kept close to ground voltage the operation of NPN transistors 928, 931, 923, resistor 932, and diodes 929 and 930 in an analogous manner.

With terminal 512 at ground voltage, transistor 821 (FIG. 8), which is controlled by control signal "SBIAS1/STBY" at terminal 511, is non-conducting. Consequently, the signal "VBD" at terminal 513 remains at ground. With signal "VBD" at ground voltage, PNP transistors 823 is non-conducting, bias signal "BI" at terminal 517 remains at ground voltage.

However, as supply voltage $V_{cc}$ rises above 6.8 volts, diode 915 breaks down, providing a low resistance path in transistor 901 through peripheral collector region 1001. Subsequently, NPN transistor 903 switches off and terminal 516 is pulled towards supply voltage $V_{CC}$, so that NPN transistor 909 is switched on, switching off NPN transistors 910, 911 and 912. Consequently, control signals "SBIAS1/STBY" and "SBIAS2/SPB" at terminals 511 and 512 are pulled towards supply voltage $V_{CC}$.

Control signal "SBIAS1/STBY" switches on NPN transistor 821 (FIG. 8) to pull signal "VBD" at terminal 513 toward supply voltage $V_{CC}$. As NPN transistor 910 (FIG. 9b) switches off, current sources provided by PNP transistors 907, 914, 915, 916, 917, 918, 919 are switched off to disable the discharge paths of input terminals 508a and 508b through NPN transistors 920 and 921. Discharge paths of output terminals 505a and 505b through NPN transistors are disabled by NPN transistor 941, which is switched on by control signal "VBD" at terminal 513. NPN transistor 941 switches off NPN transistors 925, 926, 931 and 933. Signal "VBD" at terminal 513 switches on NPN transistors 831 and 832 (FIG. 8) and PNP transistors 833 and 834. Consequently, control signals "VBU" and "VB2" at terminals 502 and 514, respectively, are pulled towards ground voltage, thereby turning on current sources provided by PNP transistors 701–710 (FIG. 7) and 601 (FIG. 6).

Control signal "SBIAS2/SPB" at terminal 511 switches on NPN transistor 835 (FIG. 8), which in turn switches on NPN transistor 836 and PNP transistors 837 and 838 to pull control signal "VBU2" at terminal 515 towards ground voltage. Control signal "VBU2" controls PNP transistor 711 (FIG. 7).

Control signal "VBD" switches on NPN transistor 802 (FIG. 8), which pulls terminal 851 towards ground voltage, thereby switching on PNP transistor 823 to a conducting state to allow current to flow through the voltage divider formed by resistors 825, 826 and 827. In this embodiment, the resistance values of resistors 825, 826 and 827 are 20K ohms, 10K ohms and 30K ohms, respectively. Thus, the output signal "bias" at terminal 517 to reach the voltage $0.5*(V_{CC}-2*V_{BE})$, where $2*V_{BE}$ is the total voltage drop across diodes 829 and 830.

At this point, audio amplifier integrated circuit 500 is initialized for functional operation. If external control signal "ISTBY" at terminal 519 is asserted (i.e pulled towards $V_{CC}$), amplifier 970 (FIG. 9a) pulls terminal 955 towards ground. Amplifier 970 is formed by PNP transistors 971–976, NPN transistors 979–980, and resistors 978, 981 and 982. The falling voltage at terminal 955 causes the output signal "OMUTE" of amplifier 991 at terminal 519 to fall below one $V_{BE}$, thereby turning off transistor 602 in input stage 520a (FIG. 6). Amplifier 991 (FIG. 9a) is formed by PNP transistors 983–985, NPN transistors 986 and resistors 987–988. Switching off transistor 602, in turn, switches off current sources provided by PNP transistors 603 and 604 to disable input circuit 630, thereby placing audio amplifier integrated circuit 500 on standby mode.

If the "IMUTE" control signal at terminal 510 is asserted, amplifier 991 also drives control signal "OMUTE" at terminal 519 to below one $V_{BE}$ to disable input circuit 630 in the same manner as described above with respect to control signal "ISTBY".

When neither "IMUTE" nor "ISTBY" is asserted, two differential input signals, provided across terminals 507a and 508a of input stage 520a and between terminals 507b and 508b of input stage 520b, are received into audio amplifier integrated circuit 500. Input stage 520a is shown in FIG. 6. As shown in FIG. 6, input signals at terminals 507a and 508a drive respectively the base terminals of NPN transistors 652 and 644 of differential amplifier 630. Differential amplifier 630 includes PNP transistors 640–643 and 649, resistors 650–651 and 646–647, NPN transistors 645 and 648, and bias circuit 670. Bias circuit 670 includes PNP transistors 604, 633–638 and resistors 631–632. Bias circuit 670 provides a feedback path from output terminal 505a to maintain a DC bias voltage for the input circuit of differential amplifier 630. This bias voltage allows a maximum voltage swing for an AC signal received across terminal 507a and 508a. When the voltage at input terminal 507a is higher than the voltage at input terminal 508a, the current in PNP transistor 649 decreases and the current in PNP transistor 643 increases, thereby pulling the output voltage at terminal 660 towards supply voltage $V_{CC}$. Consequently, the output signal at terminal 504a to output stage 522a is driven towards ground. In a similar manner, when the voltage at input terminal 507a is lower than the voltage at input terminal 508a, the output signal to output stage 522a at terminal 504a is pulled towards $V_{CC}$.

In differential amplifier 630, when the common mode voltage across terminals 507a and 508a is zero volts, PNP transistors 652, 640, 644 and 642 are conducting. Consequently, PNP transistors 643 and 649 are conducting, so that differential amplifier 630 operates from a common mode voltage of zero volts. As shown in FIG. 6, PNP transistor 644 switches off when the voltage at the terminal of either PNP transistor 644 or PNP transistor 652 reaches four $V_{BE}$'S below supply voltage $V_{CC}$.

The output voltage at terminal 504a is used to modulate the amplifier formed by NPN transistor 732 and resistor 733. The voltage swing at terminal 761, which is coupled to the emitter terminal of NPN transistor 732, is limited by diodes 744 and 745 to two $V_{BE}$'S above ground. The voltage at terminal 761 is level-shifted by resistor 747 to drive NPN transistor 731 which, in turn, drives pull-up NPN transistor 740. NPN transistor 740 and resistor 746 formed a further amplifier stage to drive pull-up power transistor 781. On the pull-down side, the level-shifted output signal of NPN transistor 731 is provided to a differential amplifier 780, which is biased in the non-inverting input terminal (base terminal of transistor 726) by the voltage divider formed by resistors 721–724. Differential amplifier 780 is formed by resistors 727–728 and PNP transistors 725–726 and 729–730, and NPN transistors 734 and 735. The output signal of amplifier 780 at terminal 748 is used to drive transistor 739 which, with resistors 741 and 749 formed another amplification stage to drive pull-down power transistor 782. In this embodiment, differential amplifier 740 performs the function of differential amplifier 313 shown in FIG. 3, and NPN transistor 731 performs the function of output NPN transistor 312 of FIG. 3. Power transistors 782 can operate from $V^{CE}$ sat (i.e. voltage across emitter and collector at saturation), which is significantly lower than the voltage attainable in the prior art. The non-inverting input terminal of is coupled by resistor 724 to output terminal 505a, so as to couple the output voltage at the bias voltage at output terminal 505a. Further, during the power up phase, after PNP transistor 711 is turned on, a current is provided to raise the voltage of output terminal 505a at the same time the bias voltage at terminal 517 rises towards the predetermined level. Hence, no pop noise is experienced at output terminal 505a. Power transistor 782 are is by resistors 711–715 and NPN transistor 742. When excessive current is detected, PNP transistor 787 is switched on to switch on PNP transistor 785 and 786, so as to disable NPN transistor 740. An analogous protective circuit is formed by resistors 716–719, and NPN transistor 743 and 738, and PNP transistors 736–737. NPN transistors 742 and 743 are provided to compensate for temperature variation in the 787 and 738, respectively.

When the supply voltage $V_{cc}$ falls on power-off below the bias voltage less four $V_{BE}$'S, NPN transistor 943 (FIG. 9a) turns off. Consequently, NPN transistor 947 switches on to pull terminal 512 (i.e. signal "SBIAS1/STBY") to ground voltage, thereby switching off NPN transistor 821, thus discharging signal "VBD" at terminal 513. Whereupon, PNP transistor 823 is switched off, and output bias voltage at terminal 517 discharges through resistors 827 and 828. With signal "VBD" discharged, control signals "VBU" and "VB2" at terminals 502 and 514, respectively, rise towards $V_{CC}$, hence disabling operation of output stage 522a by switching off the current sources controlled by control signals "VBU2" and "VB2". With output stage 522a disabled, output terminal 505a goes to high impedance state.

When supply voltage $V_{cc}$ falls below 6.8 volts, current flows through resistor 904 via collector region 1002 which, as explained above, is a higher resistance current path than the current path through collector region 1001. Consequently, the voltage at the base terminal of NPN transistor 903 rises, thereby pulling signal "THDW" at terminal 516 towards ground level. During this time, NPN transistor 909, whose base terminal is coupled to terminal 516 is in a non-conducting state, so that terminals 951, 952 and 953, which are coupled to NPN transistor 909's collector, are pulled to supply voltage $V_{CC}$. Consequently, NPN transistors 911 and 912 (FIG. 9b), which are controlled respectively by the voltages on terminals 952 and 953, are conducting, Conducting NPN transistors 911 and 912 pull the voltages of control signals "SBIAS1/STBY" and "SBIAS2/SPB" (at terminals 512 and 511) respectively, to ground. At this time, NPN transistor 910, which is controlled by the voltage at terminal 951, is conducting. Thus, PNP transistor 914 switches on, which in turn switches on PNP transistors 907, 915, 916, 917, 918 and 919. As PNP transistor 915 switches on, the voltage at terminal 956 rises towards supply voltage $V_{CC}$, thereby switching on PNP transistors 920 and 921 to provide a current discharge path for input terminals 508a and 508b ("STIMP1" and "STIMP2" respectively) to ground. Resistors 992 and 993 limits the base currents NPN transistor 921 and 920, respectively, when input terminals 508a and 508b are substantially discharged.

As PNP transistor 918 switches on, NPN transistors 922 is also switched on, providing base currents to NPN transistors 925 and 926. NPN transistor 925 thus provides a current path for discharging and maintaining output terminal 505b at ground. Diodes 923 and 924 limits the current through resistor 927, since output terminal 505b is at ground voltage when fully discharged. Terminal 505a is kept close to ground voltage the operation of NPN transistors 928, 931, 923, resistor 932, and diodes 929 and 930 in an analogous manner.

With terminal 512 at ground voltage, transistor 821 (FIG. 8), which is controlled by control signal "SBIAS1/STBY" at terminal 511, is non-conducting. Consequently, the signal "VBD" at terminal 513 remains at ground. With signal "VBD" at ground voltage, PNP transistors 823 is non-conducting, bias signal "BI" at terminal 517 continues to discharge through resistors 827 and 828.

The detailed description provided above is intended to illustrate the specific embodiments of the present invention and is not intended to be limiting. Many variations and modification are possible. The present invention is defined by the following claims.

We claim:

1. An audio amplifier circuit, comprising:
   an audio amplifier coupled to receive a first input signal and a second input signal at a first input terminal and a second input terminal respectively, and providing an output signal at an output terminal coupled to an audio speaker, said first input signal being the sum of an audio signal and a predetermined bias voltage received at a third input terminal, said second input signal being a feedback signal derived from said output signal;
   a comparator receiving a reference voltage and a supply voltage for providing a control signal indicating whether said reference voltage is higher than said supply voltage; and
   a first controlled current source, a second controlled current source and a third controlled current source, each current source receiving said control signal, for discharging, respectively, said second input terminal, said third input terminal and said output terminal in response to said control signal indicating said supply voltage is lower than said reference voltage.

2. An audio amplifier circuit as in claim 1, wherein said comparator comprises a first peripheral collector transistor having a first collector terminal and a second collector terminal, wherein a first current flows in said first collector terminal when said supply voltage is higher than said reference voltage, and wherein a second current flows in said second collector terminal when said supply voltage is lower than said reference voltage.

3. An audio amplifier circuit as in claim 1, wherein said second controlled current source receives a second control signal, said second controlled current source discharging said third terminal when said second control signal is asserted, said audio amplifier further comprising a second comparator circuit for comparing said supply voltage to a second reference voltage source and for asserting said second control signal when said second reference voltage is higher than said supply voltage.

4. An audio amplifier circuit as in claim 3, wherein said second comparator comprises a peripheral collector transistor having a first collector terminal and a second collector terminal, wherein said peripheral collector transistor provides a first current in said first collector terminal when said supply voltage is lower than said bias voltage by a predetermined value.

5. An audio amplifier circuit as in claim 4, wherein said predetermined value is provided by a voltage difference between an anode and a cathode of a diode.

* * * * *